(12) United States Patent
Putman et al.

(10) Patent No.: US 11,784,386 B2
(45) Date of Patent: *Oct. 10, 2023

(54) FAULT PROTECTED SIGNAL SPLITTER APPARATUS

(71) Applicant: Nanotronics Imaging, Inc., Cuyahoga Falls, OH (US)

(72) Inventors: John B. Putman, Celebration, FL (US); Matthew C. Putman, Brooklyn, NY (US); Damas Limoge, Brooklyn, NY (US); Michael Moskie, San Jose, CA (US); Jonathan Lee, Brooklyn, NY (US)

(73) Assignee: Nanotronics Imaging, Inc., Cuyahoga Falls, OH (US)

( * ) Notice: Subject to any disclaimer, the term of this patent is extended or adjusted under 35 U.S.C. 154(b) by 50 days.

This patent is subject to a terminal disclaimer.

(21) Appl. No.: 17/817,840

(22) Filed: Aug. 5, 2022

(65) Prior Publication Data

US 2023/0079085 A1   Mar. 16, 2023

Related U.S. Application Data

(63) Continuation of application No. 17/646,247, filed on Dec. 28, 2021, now Pat. No. 11,411,293.

(Continued)

(51) Int. Cl.
*H01P 5/16* (2006.01)
*H03M 1/10* (2006.01)
(Continued)

(52) U.S. Cl.
CPC ............... *H01P 5/16* (2013.01); *H02H 7/20* (2013.01); *H03M 1/1009* (2013.01); *G01R 31/3177* (2013.01)

(58) Field of Classification Search
CPC ...... H01R 25/003; H01R 31/02; H01R 33/76; H01R 33/88; H01R 33/945; H01R 13/447;
(Continued)

(56) References Cited

U.S. PATENT DOCUMENTS 8,751,069 B2 * 6/2014 Wellbrook .......... G06F 13/4072
                                                      701/1
2018/0007313 A1 * 1/2018 Bailey ..................... H04B 3/38

FOREIGN PATENT DOCUMENTS

CN          110098455 A      8/2019
CN          112151964 A     12/2020
(Continued)

OTHER PUBLICATIONS

PCT International Application No. PCT/US22/42230, International Search Report and Written Opinion of the International Searching Authority, dated Sep. 28, 2022, 7 pages.

(Continued)

*Primary Examiner* — Khai M Nguyen
(74) *Attorney, Agent, or Firm* — DLA PIPER LLP (US)

(57) ABSTRACT

A system is disclosed herein. The system includes a splitter board. The splitter board includes a microprocessor, a converter, and a bypass relay. The converter includes analog-to-digital circuitry and digital-to-analog circuitry. The bypass relay is configurable between a first state and a second state. In the first state, the bypass relay is configured to direct an input signal to the converter. The converter converts the input signal to a converted input signal and splits the converted input signal into a first portion and a second portion. The first portion is directed to the microprocessor. The second portion is directed to an output port of the splitter board for downstream processes. In the second state, the bypass relay is configured to cause the input signal to bypass the converter. The bypass relay directs the input (Continued)

signal to the output port of the splitter board for the downstream processes.

20 Claims, 16 Drawing Sheets

Related U.S. Application Data

(60) Provisional application No. 63/261,071, filed on Sep. 10, 2021.

(51) Int. Cl.
*G01R 31/3177* (2006.01)
*H02H 7/20* (2006.01)

(58) Field of Classification Search
CPC .......... H01R 2201/18; H04B 10/25751; H04N 7/104
USPC ......................................... 341/118, 120, 141
See application file for complete search history.

(56) References Cited

FOREIGN PATENT DOCUMENTS

| | | |
|---|---|---|
| TW | 201025720 A | 7/2010 |
| TW | I438961 B | 5/2014 |

OTHER PUBLICATIONS

Office Action and Search Report from Taiwan Patent Application No. TW111134042, dated Feb. 23, 2023, 7 Pages.

* cited by examiner

US 11,784,386 B2

FAULT PROTECTED SIGNAL SPLITTER APPARATUS

CROSS-REFERENCE TO RELATED APPLICATIONS

This application is a continuation of U.S. application Ser. No. 17/646,247, filed Dec. 28, 2021, which claims priority to U.S. Application Ser. No. 63/261,071, filed Sep. 10, 2021, which are incorporated by reference in their entireties.

FIELD OF THE DISCLOSURE

The present disclosure generally relates to a signal splitting system and a method of operating the same.

BACKGROUND

Signal splitters are often used in manufacturing for measurement and control applications where a single analog signal needs to be sent to multiple sources. The signal splitter is generally configured to receive a single input and split the single input into a primary output and a secondary output.

SUMMARY

In some embodiments, a system is disclosed herein. The system includes a splitter board including: a converter including analog-to-digital circuitry and digital-to-analog circuitry; a bypass relay coupled with the converter, the bypass relay configurable between a first state and a second state; and a microprocessor coupled with the converter and the bypass relay, the microprocessor configured to switch the bypass relay between the first state and the second state, wherein, in the first state, the bypass relay directs an input signal to the converter, wherein the converter converts the input signal to a converted input signal and splits the converted input signal into a first portion and a second portion, wherein the microprocessor is configured to apply calibration factors to the first portion and direct the first portion back to the converter for output at an output port of the splitter board for downstream processes, and output the second portion to an external server device, and wherein, in the second state, the bypass relay causes the input signal to bypass the converter and directs the input signal to the output port of the splitter board for the downstream processes.

In some embodiments, a system is disclosed herein. The system includes: a mother board including: an input relay configurable between a first position and a second position; an input pad in communication with the input relay; a switch configurable between an open position and a closed position; an output relay configurable between a first position and a second position; and an output pad in communication with the output relay; and a daughter board configured to connect to the mother board, wherein, when the daughter board is connected to the mother board, the input relay switches from the open position to the closed position, such that power is supplied to the input relay and the output relay causing the input relay to switch from the first position to the second position and the output relay from the first position to the second position, wherein in the second position, the input pad provides an input signal from the mother board to the daughter board and the output pad receives an output signal from the daughter board.

In some embodiments, a method is disclosed herein. The method includes initiating, by a microprocessor, a splitter board, wherein initiating the splitter board includes energizing a bypass relay of the splitter board, wherein, when energized, the bypass relay directs an input signal to a converter configured to convert the input signal to a converted signal and split the converted signal into a first portion and a second portion; detecting, by the microprocessor, that at least one component of the splitter board has failed; and based on the detecting, de-energizing, by the microprocessor, the bypass relay, wherein de-energizing the bypass relay causes the input signal to bypass the converter.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrated only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
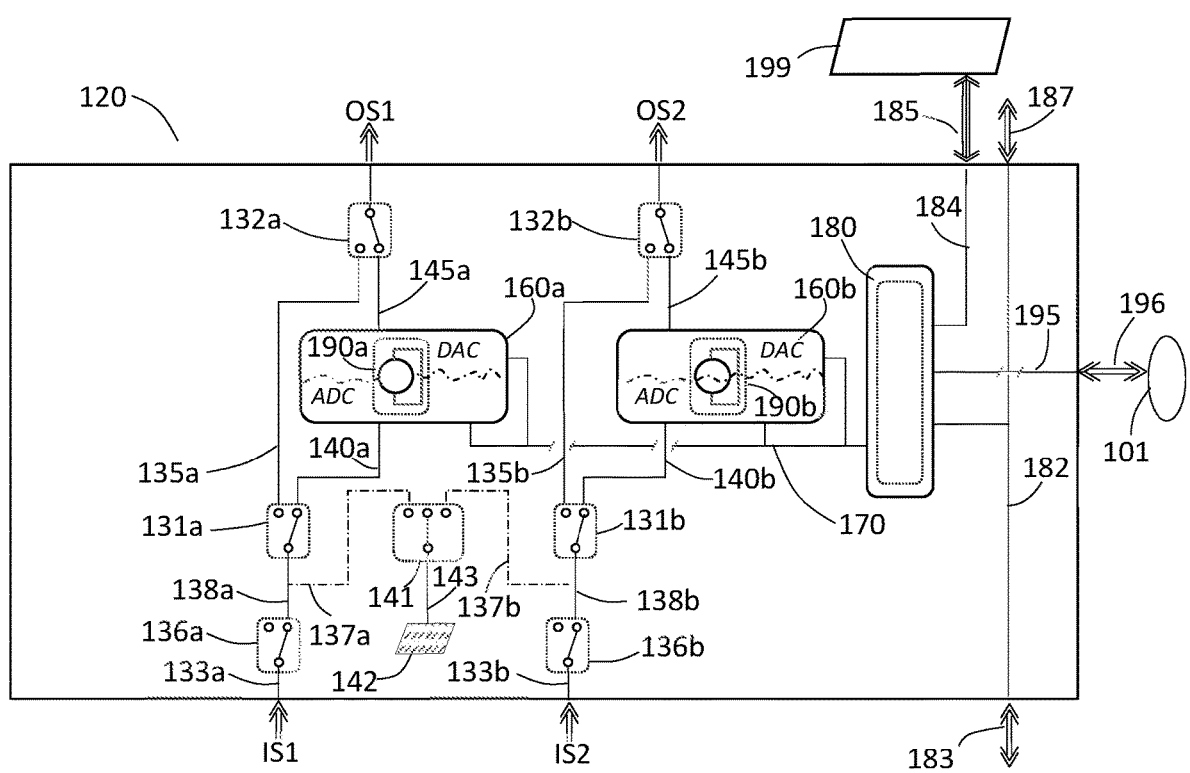
FIG. 1 is a block diagram illustrating a splitter board, according to example embodiments.

Signal splitters are often used in manufacturing, measurement, and control applications where a single analog or digital signal is sent to multiple sources. Generally, the signal splitter receives a primary input signal and outputs a primary output signal and a secondary output signal. Typically, the primary output signal may be critical to a specific purpose, such as controlling a specific process; the secondary output signal may be less critical to a specific purposes. For example, a primary output signal may control a process while a secondary output signal may be used to monitor the process. A process may continue without the secondary output, but generally cannot continue without the primary output. Because of the critical nature of the primary output, the signal splitter must continue to output the primary signal, even when the signal splitter fails.

Analog splitters are commonly used for splitting a single analog input to multiple analog outputs. Analog to digital converters (ADCs) are available for outputting a digital signal from an analog input. Similarly, digital to analog converters (DACs) are available for outputting an analog signal from a digital input.

While conventional signal splitters and analog splitters have useful applications, such devices are unable to receive an analog signal and provide multiple analog outputs. Similarly, there does not exist an apparatus or device that can receive an analog input and generate multiple digital outputs.

One or more techniques provided herein provide a solution to the limitations of conventional devices. For example, one or more techniques described herein include a method and apparatus for inputting multiple analog signals to a single board and outputting mirrored analog signals and digital signals. The one or more techniques may allow for multiple boards to be connected, such that multiple boards may be connected for combining multiple digital signals into a signal digital output. Such approach may provide fault protection if a board component associated with a specific input, such as the ADC/DAC fails; in such a case, a specific input signal may bypass the active signal circuitry and pass directly to that signal's output, while all other input signals continue to process through the ADC/DAC circuit.

In some embodiments, the present disclosure further includes one or more techniques that allow for the input channels to be calibrated without disrupting the primary output channels. For example, one or more techniques provided herein allows for the input signal to be disconnected from the ADC and the input signal to the ADC to be replaced with a calibration signal. The DAC may continue to output a buffered signal to the analog signal output during the calibration, thus allowing the ADC to be calibrated without disruption to the signal output. The active signal circuit may be re-established through the ADC/DAC after calibration.

In some embodiments, the input signal may be disconnected from the ADC and sent directly to the analog output. The input to the ADC may be replaced with the calibration signal. The analog signal output may continue during the calibration, thus allowing the ADC to be calibrated without disruption to the signal output. The active signal circuit may be re-established through the ADC/DAC after calibration.

In some embodiments, the one or more techniques provided herein may allow for a calibration signal to be continuously sent to a second channel, C2, of the ADC. For example, an input signal may be sent to a first channel, C1, of the ADC. The second channel, C2, of the ADC may calculate the calibration coefficients. In some embodiments, the second channel, C2, may calculate the calibration coefficients frequently, such as every minute, hour, day, etc. If the coefficients differ from the previous calibration by a specified amount, the new coefficients may be instantaneously provided to the first channel, C1.

In some embodiments, the calibration signal may be external and connected when the circuit is being calibrated. In some embodiments, the calibration signal may be internal. In those embodiments in which the calibration signal is internal, the calibration signals may be pre-certified and chosen to allow gain and offset calibration. In some embodiments, the firmware may be programmed to periodically (e.g., daily, weekly, monthly, etc.) verify and calibrate the inputs. In some embodiments, calibration may be initiated in an on-demand manner, through a server or dedicated controller. In some embodiments, the internal calibration may include multiple circuits to allow for full range calibration of signal inputs. This may include a zero (e.g., lowest expected signal) and span (e.g., high expected signal).

In some embodiments, one or more techniques disclosed herein provide a software or firmware approach for calibrating the system. In some embodiments, such as for external calibration, the present system allows for selection of the input signal to be calibrated. In some embodiments, a user may be prompted to selected zero and span inputs. In some embodiments, calibration data may be automatically stored on the splitter board.

In some embodiments, such as for internal calibration, the present system may allow for a time interval in which automatic calibration may be performed. In some embodiments, the present system may provide a means to recalibrate the internal calibration standard. In some embodiments, the present system may automatically set zero and span inputs according to chosen internal selection.

In some embodiments, the present system may allow a user to encode or encrypt data as that the digital date may be obfuscated from unintended users. In some embodiments, the data from auxiliary boards and/or host boards may be encoded or encrypted.

In some embodiments, the present system may allow for boards and board outputs to be authenticated. The host board and auxiliary board may be used in series, with the host board connecting to a server. The host and auxiliary boards may include authentication information, such that they may be allowed and used in a specified configuration. For example, authentication may refer to a process that ensures that a device in use with the splitter board is a recognized by firmware of the splitter board and software of the server, and that the device is permitted to be used with the splitter board. In some embodiments, a further function of the authentication process may include registration so that any of the host or auxiliary boards may only be connected to specified connecting boards. In some embodiments, the present system may provide a methodology to validate the integrity of the input signal.

FIG. 1 is a block diagram illustrating a splitter board 120, according to example embodiments. Splitter board 120 may include functions associated with a host splitter board and an auxiliary board. As shown, splitter board 120 may include at least one input signal, $IS_1$, and at least one output signal, $OS_2$. Splitter board 120 may further include a second input signal, $IS_2$, and a second output signal, $OS_2$. Those skilled in the art recognize that splitter board may include n-input signals, $IS_n$, and n-output signals, $OS_n$. For ease of discussion and illustration, FIG. 1 will include input signals $IS_1$ and $IS_2$ and output signals $OS_1$ and $OS_2$, while the remaining discussion may only refer to a single input signal and a single output signal. In some embodiments, the input signal can be an analog signal (e.g., current/voltage). In some embodiments, the input signal can be a digital state signal (TTL or digital I/O). In some embodiments, input signal, $IS_1$, may be representative of a plurality of signals. Similarly, output signal, $OS_1$, may be representative of a plurality of output signals. Generally, each input signal (e.g., $IS_1$, $IS_2$, . . . $IS_n$) may be representative of n input signals and each output signal (e.g., $OS_1$, $OS_2$, . . . $OS_n$) may be representative of m output signals. In some embodiments, n=m. In some embodiments, n>m.

The annotations for the components of splitter board 120 differentiate the active circuitry for each signal by using "a" and "b" notations. For example, the converter for the first signal may be 160a; the converter for the second signal may be 160b.

Splitter board 120 may be configured to perform the functions of both a host board and an auxiliary board. Splitter board 120 may include various electronics disposed thereon. For example, splitter board 120 may include an input relay 136a, bypass relay 131a, output relay 132a, converter 160a.

An external analog signal, $IS_1$, may be connected to splitter board 120. In some embodiments, external analog signal, $IS_1$, may be representative of one or more wires, depending on the type of signal. For example, in some embodiments, $IS_1$ may be representative of a thermocouple signal that is a two-wire input. Although FIG. 1 illustrates a single "line" input for $IS_1$, those skilled in the art understand that a specific input may consist of multiple lines or wires. External analog signal, $IS_1$, may be coupled or provided to input relay 136a. In some embodiments, external analog signal, $IS_1$, may be coupled or provided to input relay 136aa via trace 133a.

Trace 138a may connect input relay 136a to bypass relay 131a. Bypass relay 131a may be configured to switch input signal, $IS_1$, towards converter 160a or away from ADC/DAC 160a. Bypass relay 131a may toggle between an active state and a fault state depending on the state of converter 160a.

In some embodiments, an active state may refer to a situation in which splitter board 120 is acting properly. A splitter board 120 is acting properly when there is power to splitter board 120 and the components of splitter board 120 are all working. When splitter board 120 is acting properly, input analog signal, $IS_1$, may be split and converted by converter 160a into an output analog signal, $OS_1$, and digital output signals.

In some embodiments, a fault state may refer to a situation where a failure occurs. In some embodiments, a failure may be a general board failure. A general board failure may be when power to splitter board 120 fails and all outputs fail.

In some embodiments, a failure may be a single component failure. A single component failure may be when component of splitter board 120 fails. For example, converter 160a or converter 160b fails.

When in the active state, bypass relay 131a may be in a first state, in which bypass relay 131a directs input signal, $IS_1$, towards converter 160a. When in the fault state, bypass relay 131a may be in a second state, in which bypass relay 131a directs input signal, $IS_1$, towards output relay 132a, bypassing converter 160a.

Trace 140a may connect bypass relay 131a to converter 160a. In some embodiments, although not shown, splitter board 120 may include electronics or other components between bypass relay 131a and converter 160a. For example, splitter board 120 may include an amplifier between input relay 136a and converter 160a for amplifying the signal before receipt at converter 160a.

Converter 160a may be configured to split the incoming signal and convert the incoming signal from one format (e.g., digital or analog) to another format (e.g., digital or analog). For example, converter 160a may consist of two functions: analog to digital conversion (ADC) and digital to analog conversion (DAC). Converter 160a may convert input signal, $IS_1$, from analog to digital or from digital to analog. For example, converter 160a may split the input signal, $IS_1$, into a first portion and a second portion. Converter 160a may convert both portions of the input signal from an analog signal to digital signals. In the active state, converter 160a may provide the first portion of the digital signal and the second portion of the digital signal to microprocessor 180. Microprocessor 180 may be configured to apply calibration factors to the first portion of the digital signal. Once the calibration factors are applied to the first portion of the digital signal, microprocessor 180 may provide the first portion of the digital signal back to converter 160a, which may convert the digital signal back to an analog signal (but note, the calibration factors have been applied to the digital signal which is converted back to an analog signal). The analog signal may be provided to relay 132a via trace 145a for output. Although not shown, converter 160a may provide multiple output signals, $OS_n$. In some embodiments, converter 160a may direct the multiple digital output signals to multiple microprocessors 180.

As shown, trace 170 may connect converter 160a to microprocessor 180. Trace 170 may communicate information to and from microprocessor 180. Trace 170 may communicate information to and from converter 160a. In some embodiments, microprocessor 180 may be configured to communicate with and/or control converter 160a. For example, microprocessor 180 may be configured to execute firmware that controls the logic of one or more of converter 160a, input relay 136a, bypass relay 131a, and output relay 132a. In some embodiments, microprocessor 180 may be configured to read and control all signals, such that microprocessor 180 may provide logic and function to fault detection module 190a.

Converter 160a may include fault detection module 190a. Fault detection module 190a may be representative of a circuit configured to check whether converter 160a is in an active state. Fault detection module 190a may be read and controlled by microprocessor 180. Fault detection module 190a may be configured to detect faults in a variety of ways. In some embodiments, fault detection module 190a may detect faults using a general relay logic. For example, bypass relay 131a may be in an energized switched position (e.g., first state) when there is power going to splitter board 120. If the power fails, bypass relay 131a may be deenergized (e.g., a second state) and the output from bypass relay 131a may switch to fault signal 135a. In some embodiments, during the power failure, all converters (e.g., converter 160a, converter 160b, converter 160n, etc.) on splitter board 120 may be switched to a fault state. In some embodiments, embedded code logic of microprocessor 180 may be used to detect individual converter circuit failures. For example, some converters (e.g., converter 160a) may include registers, which can change during active conversion. Microprocessor 180 may check the registers to assure that they are progressively changing.

In some embodiments, converter 160a may include a digital input/output. In such embodiments, a converter 160a may be configured to generate a digital output. If in the active state, the signal can be high. If converter 160a fails, the signal would go low.

In a fault state, communications from converter 160a to microprocessor 180 fails. Instead, bypass relay 131a may output fault signal 135a to output relay 132a. Output relay 132a may be configured to receive fault signal 135a and output an output signal $OS_1$. In this manner, the original input signal, $IS_1$, may pass through, even when converter 160a is in a fault state.

In some embodiments, output relay 132a and input relay 136a may be representative of logical relays. For example, in some embodiments, output relay 132a and input relay 136a may be representative of a single multi-throw physical relay. In some embodiments, output relay 132a and input relay 136a may be representative of separate relays, with a common coil circuit. In some embodiments, output relay 132a and input relay 136a may be representative of separate relays, with software control of distinct coil circuits.

As shown, when in the active state, converter 160a outputs a digital signal to microprocessor 180 via trace 170. Microprocessor 180 may output one or more digital signals based on the input digital signal. For example, as shown, microprocessor 180 may output a first digital signal to server 199 by trace 184 through port 185. In some embodiments, microprocessor 180 may encrypt the first digital signal before providing digital signal to server 199. In some embodiments, microprocessor 180 may also output a digital signal to a dedicated controller 101 by trace 195 through connector 196. In some embodiments, microprocessor 180 may also output a digital signal to an auxiliary board (not shown) by trace 182 through port 183 connecting the auxiliary board to splitter board 120. In some embodiments, port 183 may be include one or more wires for connecting splitter board 120 to the auxiliary board. In some embodiments, microprocessor 180 may also output a digital signal to an auxiliary board (not shown) through port 187. In some embodiments, the signal may be encrypted and/or authenticated by microprocessor 180 before being provided to auxiliary board. Registration may be required so that the auxiliary boards may be daisy-chained in a specific order. In this manner, splitter board 120 may include functions associated with both a host splitter board 120 and an auxiliary board.

As shown, splitter board 120 may include additional sets of components. For example, as shown, splitter board 120 includes two sets of components (differentiated by "a" and "b" following the respective reference numerals). Those skilled in the art understand that splitter board 120 may include a single set of components or n-sets of components. For ease of discussion, two sets of components are illustrated in FIG. 1.

Splitter board 120 may further include a second set of components. The second set of components include an input relay 136b, bypass relay 131b, output relay 132b, converter 160b.

An external analog signal, $IS_2$, may be connected to splitter board 120. In some embodiments, external analog signal, $IS_2$, may be representative of one or more wires, depending on the type of signal. For example, in some embodiments, $IS_2$ may be representative of a thermocouple signal that is a two-wire input. Although FIG. 1 illustrates a single "line" input for $IS_2$, those skilled in the art understand that a specific input may consist of multiple lines or wires. External analog signal, $IS_2$, may be coupled or provided to input relay 136b. In some embodiments, external analog signal, $IS_2$, may be coupled or provided to input relay 136b a via trace 133b.

Trace 138b may connect input relay 136b to bypass relay 131b. Bypass relay 131b may be configured to switch input signal, $IS_2$, towards converter 160b or away from ADC/DAC 160b. Bypass relay 131b may toggle between an active state and a fault state depending on the state of converter 160b.

In some embodiments, an active state may refer to a situation in which splitter board 120 is acting properly. A splitter board 120 is acting properly when there is power to splitter board 120 and the components of splitter board 120 are all working. When splitter board 120 is acting properly, input analog signal, $IS_2$, may be split and converted by converter 160b into an output analog signal, $OS_2$, and digital output signals.

In some embodiments, a fault state may refer to a situation where a failure occurs. In some embodiments, a failure may be a general board failure. A general board failure may be when power to splitter board 120 fails and all outputs fail. In some embodiments, a failure may be a single component failure. A single component failure may be when component of splitter board 120 fails. For example, converter 160b or converter 160b fails.

When in the active state, bypass relay 131b may be in a first state, in which bypass relay 131b directs input signal, $IS_2$, towards converter 160b. When in the fault state, bypass relay 131b may be in a second state, in which bypass relay 131b directs input signal, $IS_2$, towards output relay 132b, bypassing converter 160b.

Trace 140b may connect bypass relay 131b to converter 160b. In some embodiments, although not shown, splitter board 120 may include electronics or other components between bypass relay 131b and converter 160b. For example, splitter board 120 may include an amplifier between input relay 136b and converter 160b for amplifying the signal before receipt at converter 160b.

Converter 160b may be configured to split the incoming signal and convert the incoming signal from one format (e.g., digital or analog) to another format (e.g., digital or analog). For example, converter 160b may consist of two functions: analog to digital conversion (ADC) and digital to analog conversion (DAC). Converter 160b may convert input signal, $IS_2$, from analog to digital or from digital to analog. For example, converter 160b may split the input signal, $IS_2$, into a first portion and a second portion. Converter 160b may convert both portions of the input signal from an analog signal to digital signals. In the active state, converter 160b may provide the first portion of the digital signal and the second portion of the digital signal to microprocessor 180. Microprocessor 180 may be configured to apply calibration factors to the first portion of the digital signal. Once the calibration factors are applied to the first portion of the digital signal, microprocessor 180 may provide the first portion of the digital signal back to converter 160*b*, which may convert the digital signal back to an analog signal (but note, the calibration factors have been applied to the digital signal which is converted back to an analog signal). The analog signal may be provided to relay 132*b* via trace 145*b* for output. Although not shown, converter 160*b* may provide multiple output signals, $OS_n$. In some embodiments, converter 160*b* may direct the multiple digital output signals to multiple microprocessors 180.

As shown, trace 170 may connect converter 160*b* to microprocessor 180. Trace 170 may communicate information to and from microprocessor 180. Trace 170 may communicate information to and from converter 160*b*. In some embodiments, microprocessor 180 may be configured to communicate with and/or control converter 160*b*. For example, microprocessor 180 may be configured to execute firmware that controls the logic of one or more of converter 160*b*, input relay 136*b*, bypass relay 131*b*, and output relay 132*b*. In some embodiments, microprocessor 180 may be configured to read and control all signals, such that microprocessor 180 may provide logic and function to fault detection module 190*b*.

Converter 160*b* may include fault detection module 190*b*. Fault detection module 190*b* may be representative of a circuit configured to check whether converter 160*b* is in an active state. Fault detection module 190*b* may be read and controlled by microprocessor 180. Fault detection module 190*b* may be configured to detect faults in a variety of ways. In some embodiments, fault detection module 190*b* may detect faults using a general relay logic. For example, bypass relay 131*b* may be in an energized switched position (e.g., first state) when there is power going to splitter board 120. If the power fails, bypass relay 131*b* may be deenergized (e.g., a second state) and the output from bypass relay 131*b* may switch to fault signal 135*b*. In some embodiments, during the power failure, all converters (e.g., converter 160*b*, converter 160*b*, converter 160*n*, etc.) on splitter board 120 may be switched to a fault state. In some embodiments, embedded code logic of microprocessor 180 may be used to detect individual converter circuit failures. For example, some converters (e.g., converter 160*b*) may include registers, which can change during active conversion. Microprocessor 180 may check the registers to assure that they are progressively changing.

In some embodiments, converter 160*b* may include a digital input/output. In such embodiments, a converter 160*b* may be configured to generate a digital output. If in the active state, the signal can be high. If converter 160*b* fails, the signal would go low.

In a fault state, communications from converter 160*b* to microprocessor 180 fails. Instead, bypass relay 131*b* may output fault signal 135*b* to output relay 132*b*. Output relay 132*b* may be configured to receive fault signal 135*b* and output an output signal $OS_2$.

In some embodiments, output relay 132*b* and input relay 136*b* may be representative of logical relays. For example, in some embodiments, output relay 132*b* and input relay 136*b* may be representative of a single multi-throw physical relay. In some embodiments, output relay 132*b* and input relay 136*b* may be representative of separate relays, with a common coil circuit. In some embodiments, output relay 132*b* and input relay 136*b* may be representative of separate relays, with software control of distinct coil circuits.

As shown, when in the active state, converter 160*b* outputs a digital signal to microprocessor 180 via trace 170. Microprocessor 180 may output one or more digital signals based on the input digital signal. For example, as shown, microprocessor 180 may output a digital signal to server 199 by trace 184 through port 185. In some embodiments, microprocessor 180 may encrypt the digital signal before providing digital signal to server 199. In some embodiments, microprocessor 180 may also output a digital signal to a dedicated controller by trace 195 through connector 196. In some embodiments, microprocessor 180 may also output a digital signal to an auxiliary board (not shown) by trace 182 through port 183 connecting the auxiliary board to splitter board 120. In some embodiments, port 183 may be include one or more wires for connecting splitter board 120 to the auxiliary board. In some embodiments, the signal may be encrypted and/or authenticated by microprocessor 180 before being provided to auxiliary board. Registration may be required so that the auxiliary boards may be daisy-chained in a specific order.

When splitter board 120 includes more than one set of components (e.g., a-components and b-components), microprocessor 180 may receive digital outputs from both converter 160*a* and converter 160*b*. In some embodiments, such as when either converter 160*a* or converter 160*b* fails, microprocessor 180 may receive digital output from the converter that is still in the active state. When both converter 160*a* and converter 160*b* are in the active state, microprocessor 180 may aggregate data from both converter 160*a* and converter 160*b*. For example, microprocessor 180 may aggregate the digital output from converter 160*a* with the digital output from converter 160*b*. In such embodiments, microprocessor 180 may provide the aggregated data to server 199 by trace 184 through port 185. Similarly, microprocessor 180 may provide the aggregated data to a dedicated controller by trace 195 through connector 196; and a digital signal to an auxiliary board by trace 182 through port 183.

In some embodiments, splitter board 120 may further include an internal calibration circuit. The internal calibration circuit includes calibration relay 141, a calibration device 142, and a calibration signal 143. In some situations, it may be necessary or useful to calibrate one or more converters (e.g., converter 160*a* and/or converter 160*b*) on splitter board 120. For example, the ADC of converter 160*a* and/or converter 160*b* may be calibrated. During the calibration process, the input signals, $IS_1$ and/or $IS_2$, may be disconnected and converter 160*a* and/or converter 160*b* may be placed in a calibration state. For example, as shown, input signal, $IS_1$, may be provided to input relay 136*a*, which may pass the input signal to calibration relay 141 via trace 137*a*. Similarly, input signal, $IS_2$, may be provided to input relay 136*b*, which may pass the input signal to calibration relay 141 via trace 137*b*.

For ease of discussion, the following description will only describe the calibration for the a-components. Those skilled in the art understand that such process can also be performed for the b-components, or more broadly, the n-components of splitter board 120.

Calibration device 142 may be configured to calibrate converter 160*a*. Calibration device 142 may include multiple signals that may be used to calibrate the ADC of calibration device 142. In some embodiments, the calibration signals may include a low reference signal, LRS, and a high reference signal, HRS. The LRS may represent the lowest expected analog signal; the HRS may represent the highest expected analog signal. The number of reference signals may vary depending on the linearity of the input signal. Calibration device 142 may output a calibration signal 143 to calibration relay 141. In some embodiments, microprocessor 180 may include logic to change calibration signal 143 from LRS to HRS or from HRS to LRS. Microprocessor 180 may control calibration relay 141 such that the output calibration signal is sent to the desired ADC. In this manner, calibration circuit may ensure that the measured signal accurately reflects the correct values.

Figure 2:
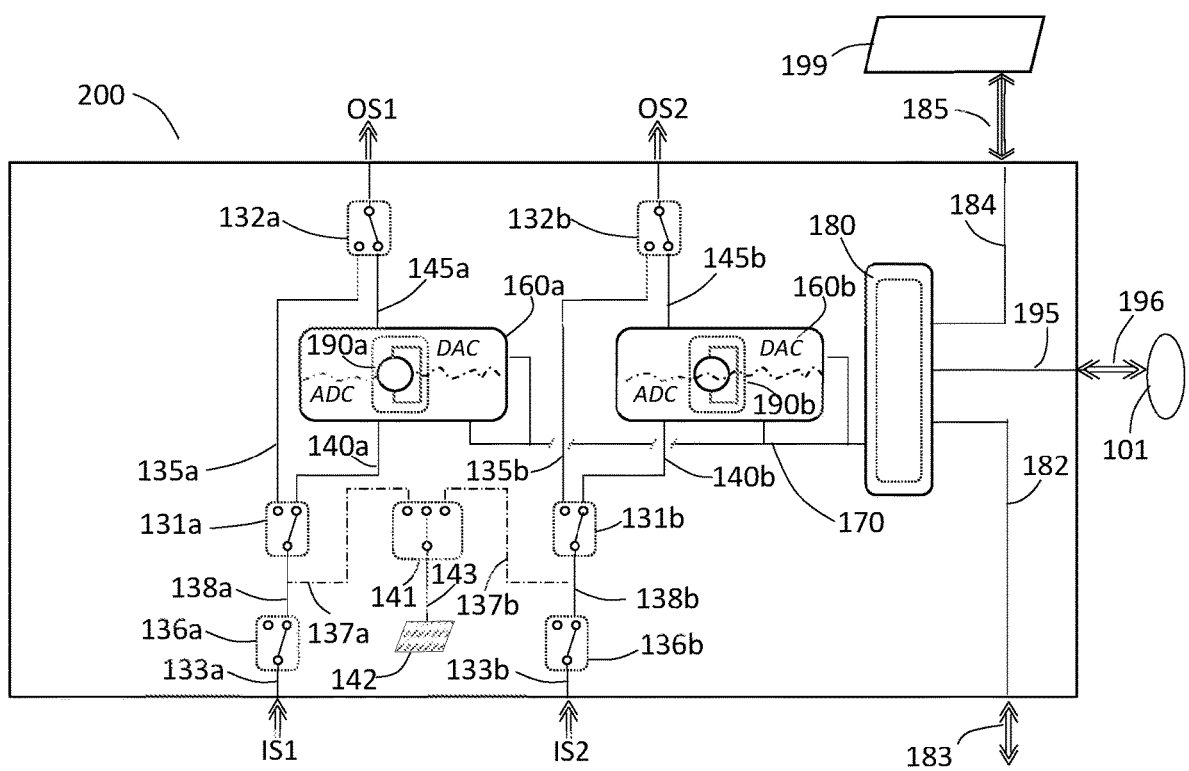
FIG. 2 is a block diagram illustrating a splitter board, according to example embodiments.

FIG. 2 is a block diagram illustrating a splitter board 200, according to example embodiments. Splitter board 200 may have an architecture that is similar to splitter board 120. To easily illustrate the components that splitter board 200 have in common with splitter board, the same reference numerals have been used.

Splitter board 200 may be representative of a first or primary board in a chain of auxiliary boards. For example, splitter board 200 may be configured to accumulate data from auxiliary boards via port 183 and communicate the data to server 199 via port 185. In some embodiments, server 199 may provide input and instructions to splitter board 200. In some embodiments, server 199 may provide input and instructions to any of the auxiliary boards via splitter board 200. Splitter board 200 may differ from splitter board 120 in that splitter board 200 may only connect to server 199 through trace 184 and port 185. Splitter board 200 may only include one port 183.

In other words, splitter board 200 may be a dedicated host splitter board while splitter board 120 may include functionality of both a host splitter board and an auxiliary splitter board.

Figure 3:
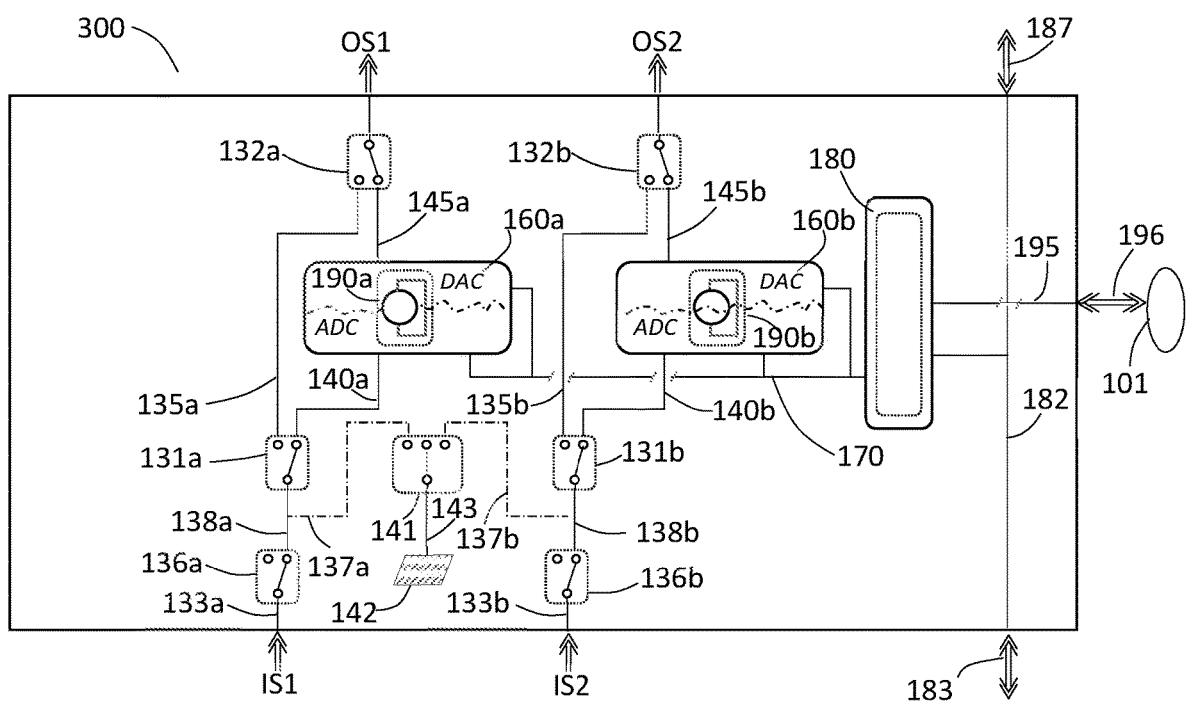
FIG. 3 is a block diagram illustrating an auxiliary board, according to example embodiments.

FIG. 3 is a block diagram illustrating an auxiliary board 300, according to example embodiments. Auxiliary board 300 may have an architecture that is similar to splitter board 120. To easily illustrate the components that auxiliary splitter board 300 have in common with splitter board 120, the same reference numerals have been used.

Auxiliary board 300 may provide the functions of linking to other boards where applicable, or to multiple other auxiliary boards. As previously discussed, multiple auxiliary boards may be daisy-chained together with the first auxiliary board connected directly to splitter board 200 or splitter board 120.

As shown, auxiliary board 300 may not be directly connected to server 199. Instead, auxiliary board 300 may be configured such that auxiliary board 300 connects to two other boards through port 183 and port 185, respectively. For example, when auxiliary board 300 is the first auxiliary board in a series of auxiliary boards, either port 183 or port 187 is connected to splitter board 200. The remaining port (port 183 or port 187) may be connected to another auxiliary board. In some embodiments, when used in connection with splitter board 200 or another auxiliary board, auxiliary board 300 may be authenticated to permit use of the board. Auxiliary board 300 may link to splitter board 200 or another auxiliary board via port 187. Auxiliary board 300 may also link to another auxiliary board via port 183.

Figure 4:
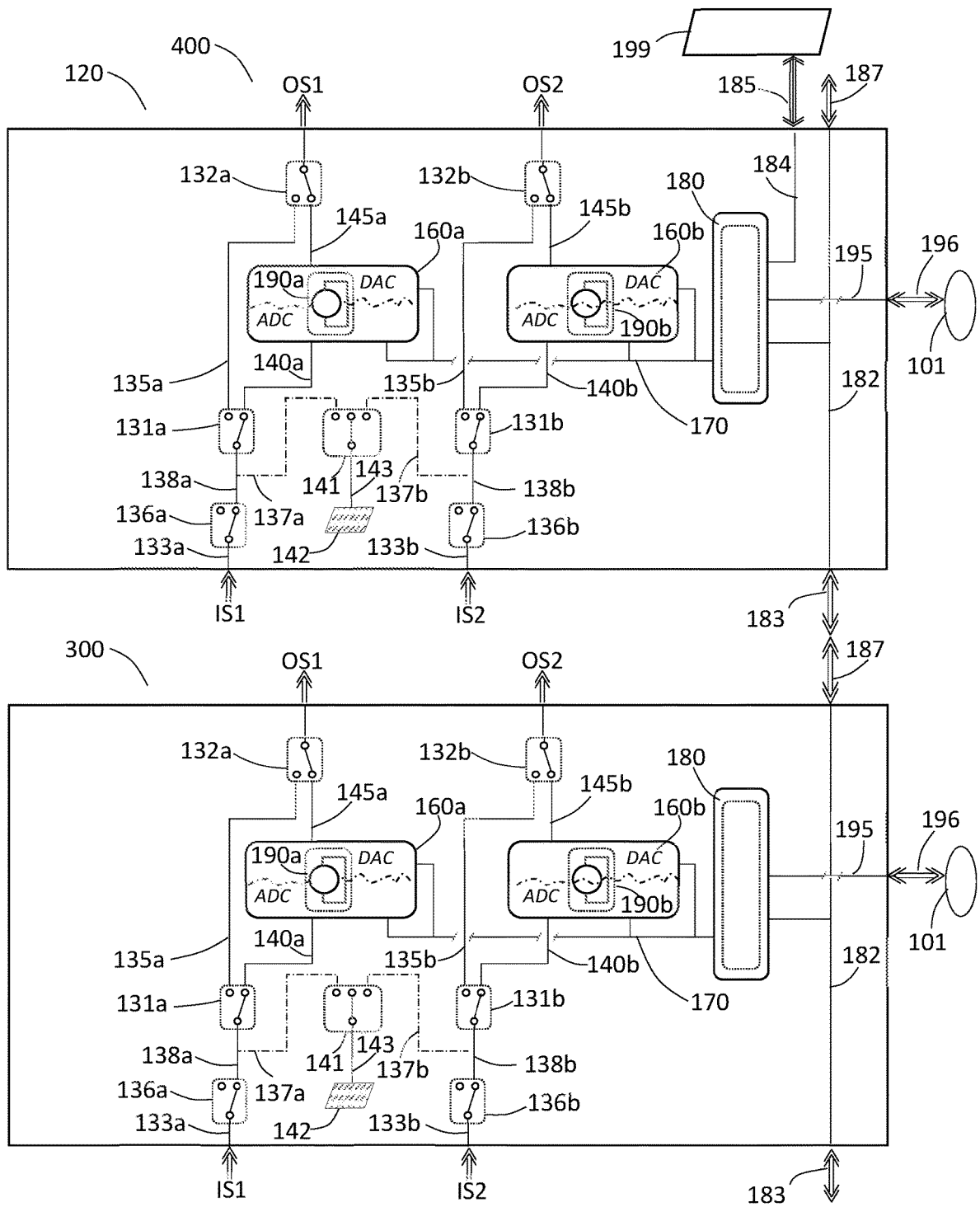
FIG. 4 is a block diagram illustrating splitter board and auxiliary board arranged in a daisy chain configuration 400, according to example embodiments.

FIG. 4 is a block diagram illustrating splitter board 120 and auxiliary board 300 arranged in a daisy chain configuration 400, according to example embodiments.

As shown, port 183 of splitter board 120 may be connected to port 187 of auxiliary board 300. In some embodiments, port 183 may be connected to port 187 through any means, such as, but not limited to, universal serial bus (USB), serial, Modbus, Ethernet, or other well-known communication means. Accordingly, output from auxiliary board 300 may be provided to splitter board.

Host splitter board 120 may provide the output from auxiliary board 300 to server 199. Splitter board may be connected to server 199 through port 185. In some embodiments, port 185 may be connected to server 199 through any means, such as, but not limited to, USB, serial, Modbus, Ethernet, or other well-known communication means. As shown, inputs from auxiliary board 300 may be provided to microprocessor 180 via trace 182. In some embodiments, microprocessor 180 may simply pass the signal from auxiliary board 300 to server 199. In some embodiments, microprocessor 180 may aggregate the signal from auxiliary board 300 with any other input signals from other auxiliary boards or the signal generated by host splitter board 120.

Figure 5:
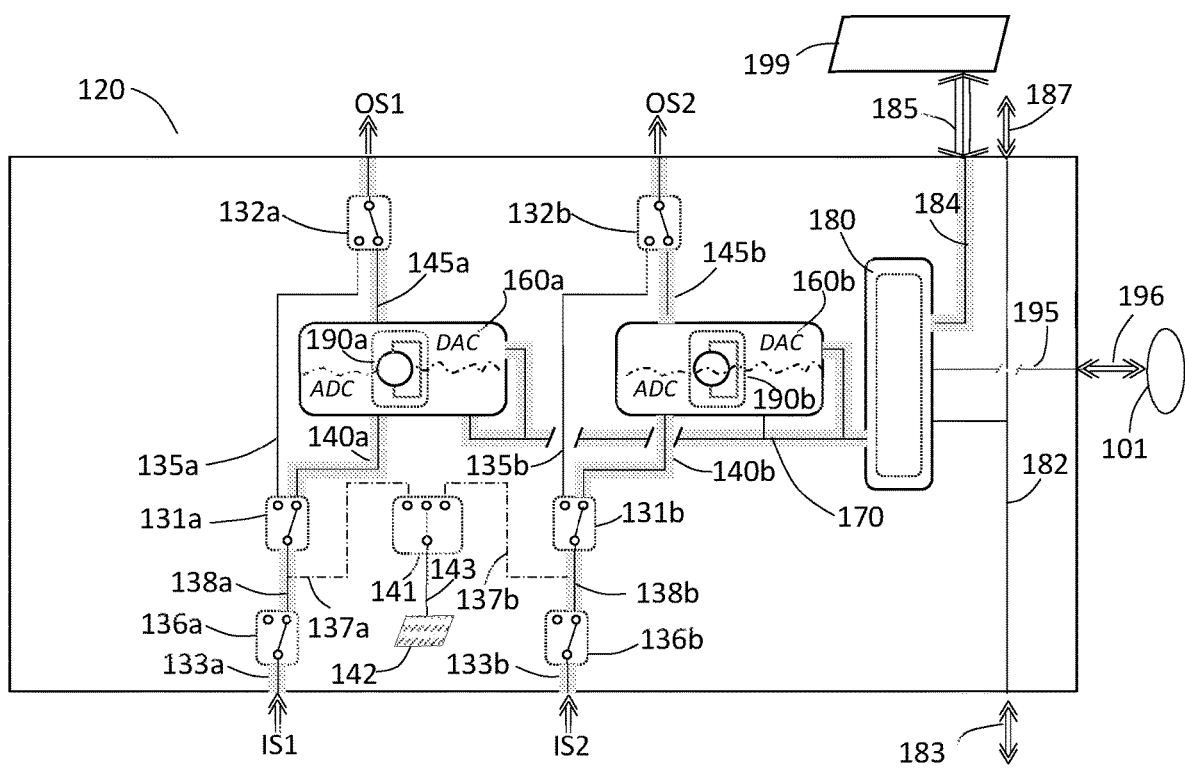
FIG. 5 is a block diagram illustrating splitter board when splitter board is in the active state, according to example embodiments.

FIG. 5 is a block diagram illustrating splitter board 120 when splitter board 120 is in the active state, according to example embodiments.

For ease of discussion, the path of the signals through splitter board 120 are emphasized. In the active state, input signal, $IS_1$, flows through relay 136*a* to bypass relay 131*a* via trace 138*a*. Relay 136*a* is in a de-energized position. When instructed by microprocessor 180, relay 136*a* may be energized, such as when converter 160*a* is to be calibrated. When in the de-energized position, the signal may pass through relay 136*a* to bypass relay 131*a* via trace 138*a*. Bypass relay 131*a* is shown in the energized position. When energized, the signal is passed through active circuitry of relay 136*a* to converter 160*a*. In some embodiments, the active circuitry of bypass relay 131*a* may include signal conditioning, such as amplification. Converter 160*a* splits the input signal and converts the split input signal to a digital signal. For example, the ADC of converter 160*a* may convert the analog input signal to a digital signal. The split digital input signal is provided to microprocessor 180 via trace 170. Microprocessor 180 may interpret the signal and send an instruction to one or more outputs (e.g., server 199, controller 101, etc.). In some embodiments, microprocessor 180 may apply a calibration factor to a first digital signal to ensure the accuracy of the signal. Microprocessor 180 may communicate the calibrated digital signal to the DAC of converter 160*a*. Converter 160*a* may convert the calibrated digital signal to an analog signal. Converter 160*a* may output the analog signal to output relay 132*a* via trace 145*a*. The analog signal may be available to external devices via $OS_1$.

Similarly, input signal, $IS_2$, flows through relay 136*b* to bypass relay 131*b* via trace 138*b*. Relay 136*b* is in a de-energized position. When instructed by microprocessor 180, relay 136*b* may be energized, such as when converter 160*b* is to be calibrated. When in the de-energized position, the signal may pass through relay 136*b* to bypass relay 131*b* via trace 138*b*. Bypass relay 131*b* is shown in the energized position. When energized, the signal is passed through active circuitry of relay 136*b* to converter 160*b*. In some embodiments, the active circuitry of bypass relay 131*b* may include signal conditioning, such as amplification. Converter 160*b* splits the input signal and converts the split input signal to a digital signal. For example, the ADC of converter 160*b* may convert the analog input signal to a digital signal. The split digital input signal is provided to microprocessor 180 via trace 170. Microprocessor 180 may interpret the signal and send an instruction to one or more outputs (e.g., server 199, controller 101, etc.). In some embodiments, microprocessor 180 may apply a calibration factor to a first digital signal to ensure the accuracy of the signal. Microprocessor 180 may communicate the calibrated digital signal to the DAC of converter 160*b*. Converter 160*b* may convert the calibrated digital signal to an analog signal. Converter 160*b* may output the analog signal to output relay 132*b* via trace 145*b*. The analog signal may be available to external devices via $OS_2$.

In some embodiments, microprocessor 180 may aggregate the digital signals from converter 160a and converter 160b for transmission to server 199. In some embodiments, microprocessor 180 may encrypt the output signal prior to transmission.

Figure 6A:
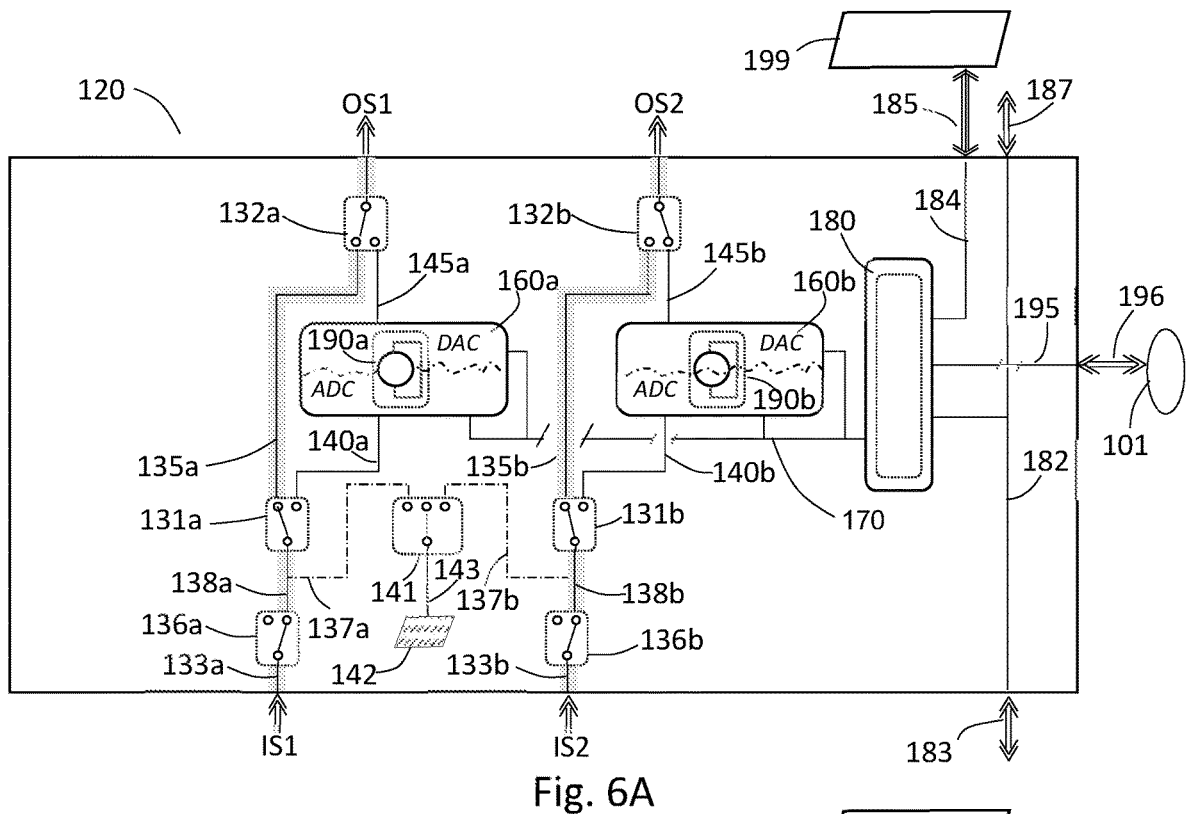
FIG. 6A is a block diagram illustrating splitter board when splitter board is in the fault state, according to example embodiments.

FIG. 6A is a block diagram illustrating splitter board 120 when splitter board 120 is in the fault state, according to example embodiments.

For ease of discussion, the path of the signals through splitter board 120 are emphasized.

In some embodiments, such as that shown in FIG. 6A, the fault state may be caused by general board failure due to a loss of board power. Several components of splitter board 120 require power to operate. For example, microprocessor 180, converters 160a, 160b, and relays 136a, 136b, 131a, 131b, 132a, and 132b typically require power to operate When in the fault state, input relay 136a may pass the signal through to bypass relay 131a via trace 138a. During a power failure, bypass relay 131a may revert to a de-energized position. In the de-energized position, the input signal may be passed directly to output relay 132a and subsequently to output $OS_1$. In other words, during a power failure, all inputs may bypass the active circuitry. The original input signal, $IS_1$, may be available at the output port, $OS_1$. In this manner, downstream processes external to splitter board 120 that require the original input signal may continue without interruption. Meanwhile, digital outputs that would normally be output via ports 183, 185, 187 are not available until power is restored.

Similarly, input relay 136b may pass the signal through to bypass relay 131b via trace 138b. During a power failure, bypass relay 131b may revert to a de-energized position. In the de-energized position, the input signal may be passed directly to output relay 132b and subsequently to output $OS_2$. In other words, during a power failure, all inputs may bypass the active circuitry. The original input signal, $IS_2$, may be available at the output port, $OS_2$. In this manner, downstream processes external to splitter board 120 that require the original input signal may continue without interruption. Meanwhile, digital outputs that would normally be output via ports 183, 185, 187 are not available until power is restored.

Figure 6B:
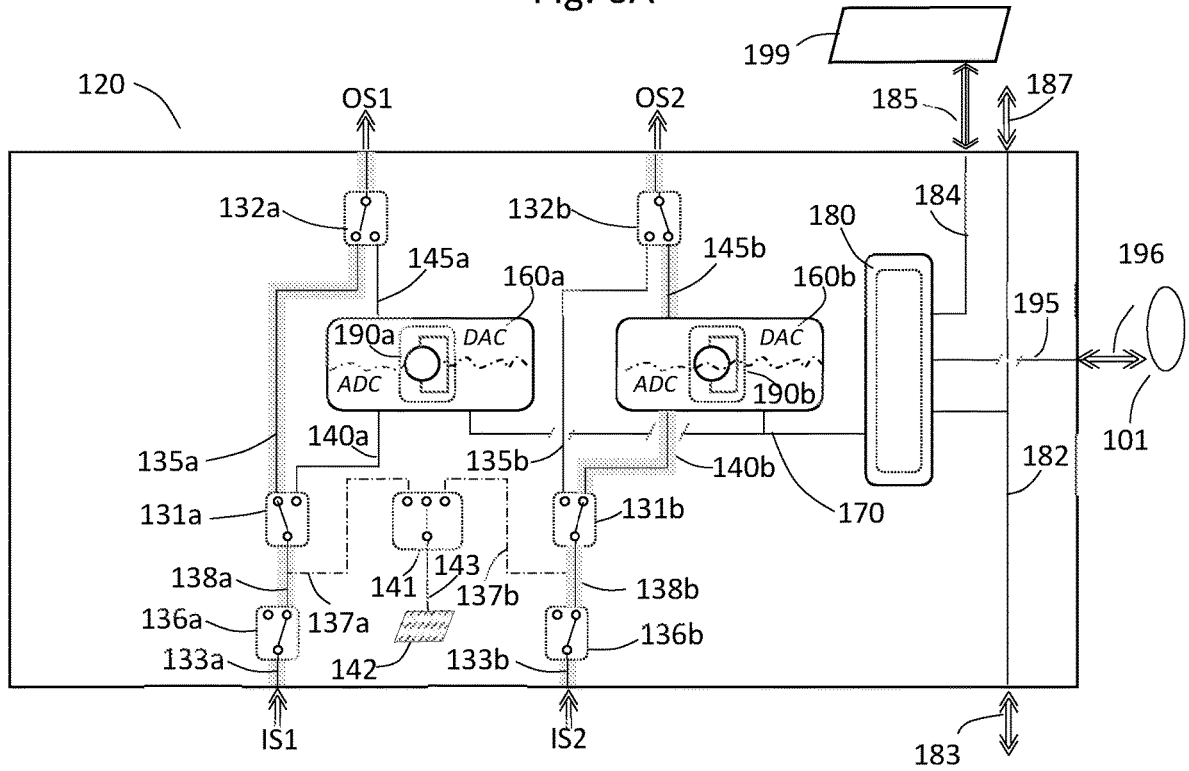
FIG. 6B is a block diagram illustrating splitter board when splitter board is in the fault state, according to example embodiments.

FIG. 6B is a block diagram illustrating splitter board 120 when splitter board 120 is in the fault state, according to example embodiments.

For ease of discussion, the path of the signals through splitter board 120 are emphasized.

In some embodiments, such as that shown in FIG. 6B, the fault state may be caused by a single component on splitter board 120 failing. As shown, the set of a-components may experience a failure. For example, one of converter 160a, relay 136a, bypass relay 131a, or relay 132a may have failed. Accordingly, input signal, $IS_1$, may be in the fault state while input signal, $IS_2$, may be in the active state. In such embodiments, bypass relay 131a and output relay 132a for input, $IS_1$, may behave as described in FIG. 6A above, bypassing all active circuitry and directing the input to output port $OS_1$. Bypass relay 131b and output bypass relay 131b may remain in the active state, as described above in conjunction with FIG. 5.

In the case of component failure, only the circuit where the component fails is redirected through the bypass circuitry. For example, if converter 160a failed, the input signal would by passed through the "a" bypass circuitry. Component failure may be monitored through fault detection module 190a and 190b. For example, fault detection module 190a may continually or continuously check to assure that converter 160a or other components are in an active state.

Fault detection module 190a may be read and controlled by microprocessor 180. In some embodiments, microprocessor 180 may detect a fault using general relay logic. For example, bypass relay 131a may be in the energized switched position (such as that shown in FIG. 1), when there is power to splitter board 120. If power fails, bypass relay 131a may be de-energized and the output from bypass relay 131a may be switched to fault signal 135a. During power failure, all converters 160a-160n revert to a fault state. In some embodiments, microprocessor 180 may utilize embedded code logic to detect individual converter circuit failures. For example, converter 160a may include registers that change during active conversion. Microprocessor 180 may check the registers to ensure that they are progressively changing. In another example, if converter 160a includes digital input/out, a digital signal can be output. If active, the signal can be high; if the converter fails, the signal would go low.

Figure 7:
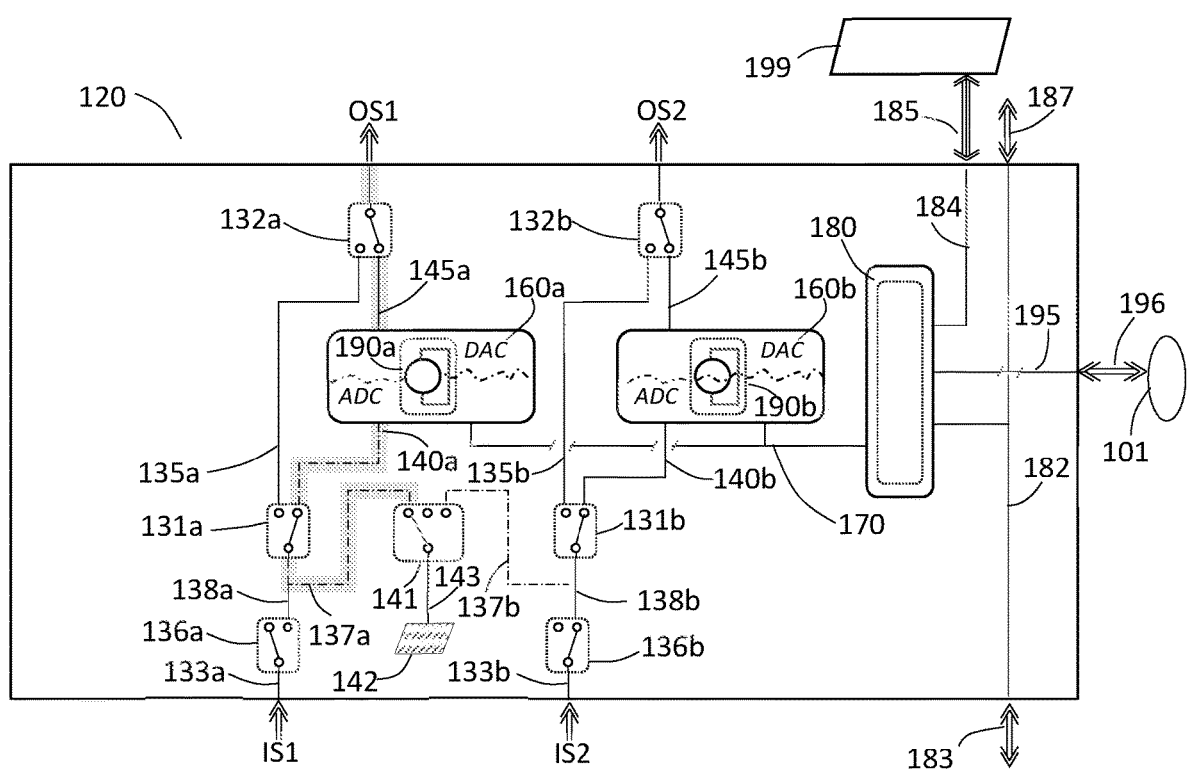
FIG. 7 is a block diagram illustrating splitter board undergoing a calibration process, according to example embodiments.

FIG. 7 is a block diagram illustrating splitter board 120 undergoing a calibration process, according to example embodiments.

Splitter board 120 is able to maintain an analog output to downstream processes even during a calibration process. As shown, converter 160a may undergo a calibration process. During the calibration process, bypass relay 131a may switch states such that input signal $IS_1$ is not sent to converter 160a. In some embodiments, before switching states, converter 160a may buffer the input signal $IS_1$. Instead, signals for calibration device 142 may be used to calibrate the ADC of converter 160a. Further, the DAC of converter 160a may output the buffered analog output signal, during calibration, such that the process signal is not disrupted. Calibration relay 141 may be activated such that the signal from calibration device 142 is sent to the ADC of converter 160a through bypass relay 131a.

As illustrated, the calibration signal may flow through the same components as the input signal $IS_1$ during the calibration process. In some embodiments, the process signal may also flow through the ADC of converter 160a. Following completion of calibration, microprocessor 180 may return the DAC of converter 160a to real-time output. Microprocessor 180 may further return calibration relay 141 to its original state. Microprocessor 180 may further return input relay 136a to its previous state, returning the input signal to the ADC of converter 160a.

In some embodiments, the calibration signal may be directed through bypass relay 131a so that the calibration signal may be subject to the same circuitry as the original input signal, $IS_1$. For example, if there is amplification of the input signal between input relay 136a and bypass relay 131a or between bypass relay 131a and converter 160a, the calibration signal may be passed through the same circuitry. Generally, calibration device 142 may be configured to calibrate any converter of splitter board 120 via calibration relay 141, which may direct the calibration signal to other ADCs of other converters.

Further, although calibration device 142 is shown as being a component of splitter board 120, those skilled in the art recognize that, in some embodiments, calibration device 142 may be external to splitter board 120.

Figure 8:
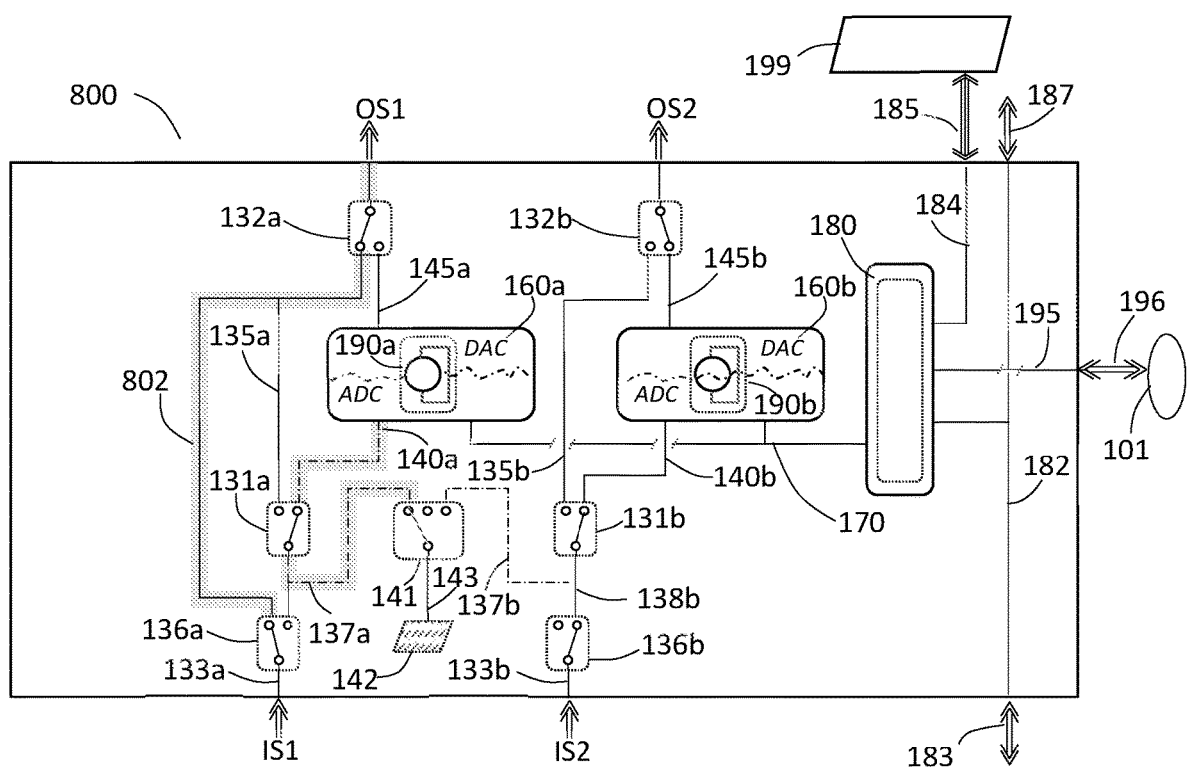
FIG. 8 is a block diagram illustrating splitter board undergoing a calibration process, according to example embodiments.

FIG. 8 is a block diagram illustrating splitter board 800 undergoing a calibration process, according to example embodiments.

Splitter board 800 may be configured similarly to splitter board 120 described above. In the example shown in FIG. 8, splitter board 800 may further include calibration bypass 802. Calibration bypass 802 may connect input signal, $IS_1$, to the analog output signal, $OS_1$.

During calibration, bypass relay 131a may switch states, such that input signal, $IS_1$, is sent directly to output relay 132a via calibration bypass 802. Output relay 132a may switch states, such that input signal, $IS_1$, is directed to output port, $OS_1$. Calibration relay 141 may be activated so that the signal from calibration device 142 may be sent to the ADC of converter 160a through bypass relay 131a. The signals from calibration device 142 may be used to calibrate the ADC.

Following calibration, calibration relay 141 may be returned to its previous state. Bypass relay 131a may be returned to its previous state, returning the input signal, $IS_1$, to the ADC of converter 160a. In this manner, splitter board 800 is able to maintain the analog output without disruption.

Figure 9:
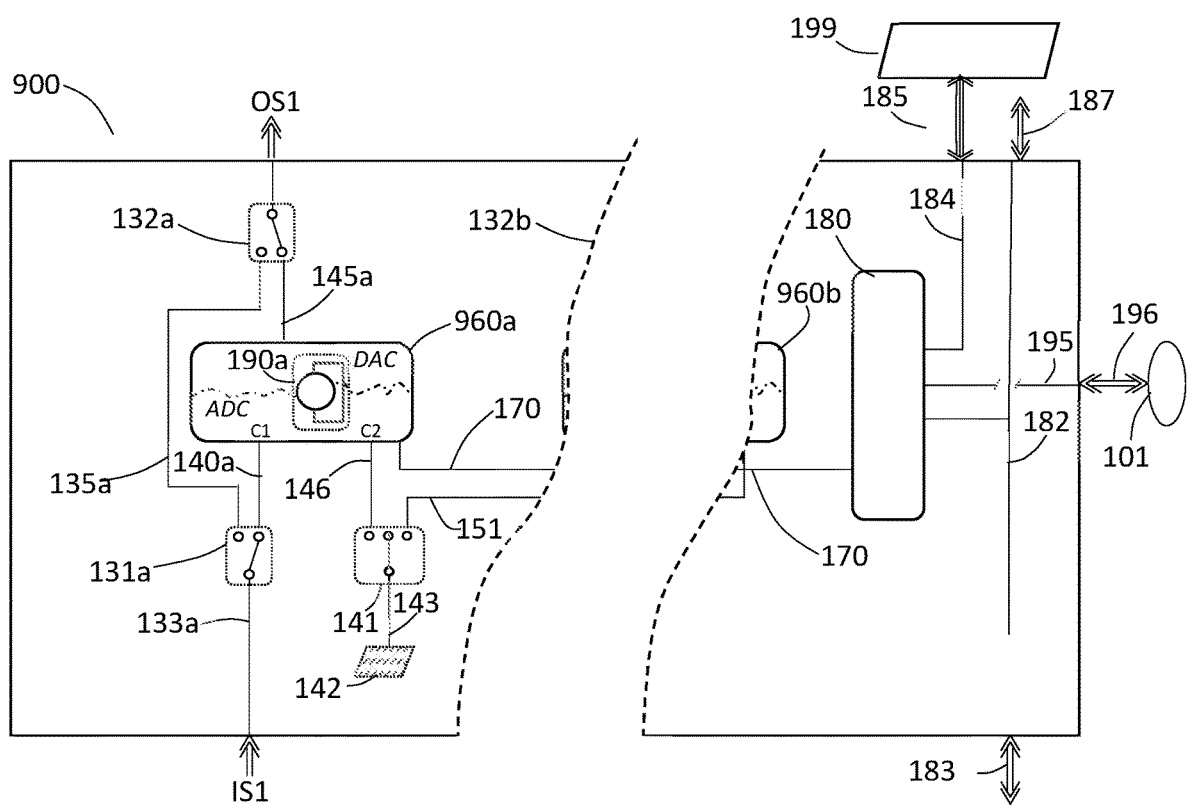
FIG. 9 is a block diagram illustrating splitter board, according to example embodiments.

FIG. 9 is a block diagram illustrating splitter board 900, according to example embodiments. As shown, splitter board 900 may be configured similarly to splitter board 120. Splitter board 900 may include converter 960a which includes two ADC channels, C1 and C2. Calibration device 142 may be connected to ADC channel, C1, of converter 960a through trace 146. Calibration device 142 may be connected to ADC channel, C2, of converter 960b through trace 151. In some embodiments, channel, C1, may be on the same ADC chip or a different ADC chip.

Channel, C2, may be calibrated on a routine basis. For example, channel, C2, may be calibrated hourly, daily, weekly, or any desired interval. In some embodiments, the calibration parameters are stored by microprocessor 180. Microprocessor 180 may compare current calibration values to the previously stored calibration values. When the current calibration values differ from the stored calibration values by a predefined amount, microprocessor 180 may write new calibration parameters for ADC channel, C1. Such process, i.e., the writing of new calibration parameters, can occur without significant disruption to the output signal, OS.

Figure 10:
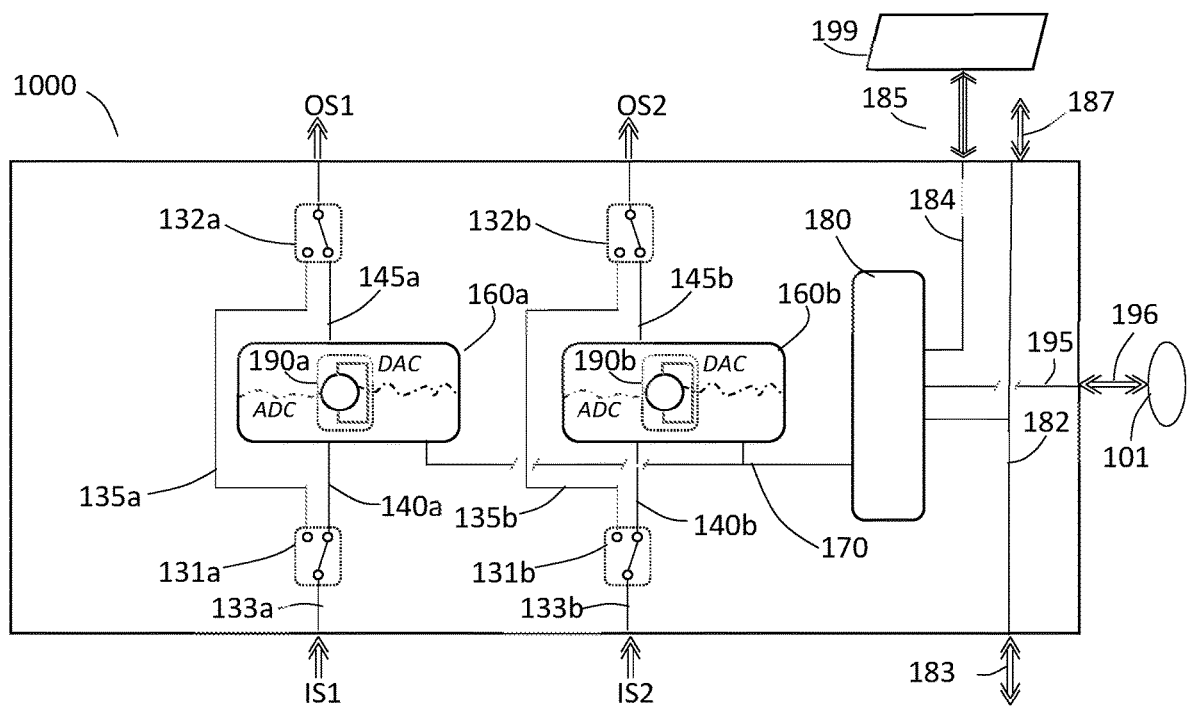
FIG. 10 is a block diagram illustrating splitter board, according to example embodiments.

FIG. 10 is a block diagram illustrating splitter board 1000, according to example embodiments. Splitter board 1000 may include components similar to those of splitter board 120. Splitter board 1000 differs from splitter board 120 in that splitter board 1000 can perform calibration without a separate calibration circuit.

As shown, the calibration circuitry of splitter board 120 is eliminated from splitter board 1000. To calibrate splitter board 1000, the input signals, e.g., $IS_1$ and/or $IS_2$, may be disconnected from splitter board 1000. A calibration device (now shown) may be connected to splitter board 1000 where the input signals would be connected. Calibration device may then calibrate converter 160a and/or converter 160b. Following calibration, the calibration device may be disconnected from splitter board 1000 and the input signals may be reconnected.

Figure 11A:
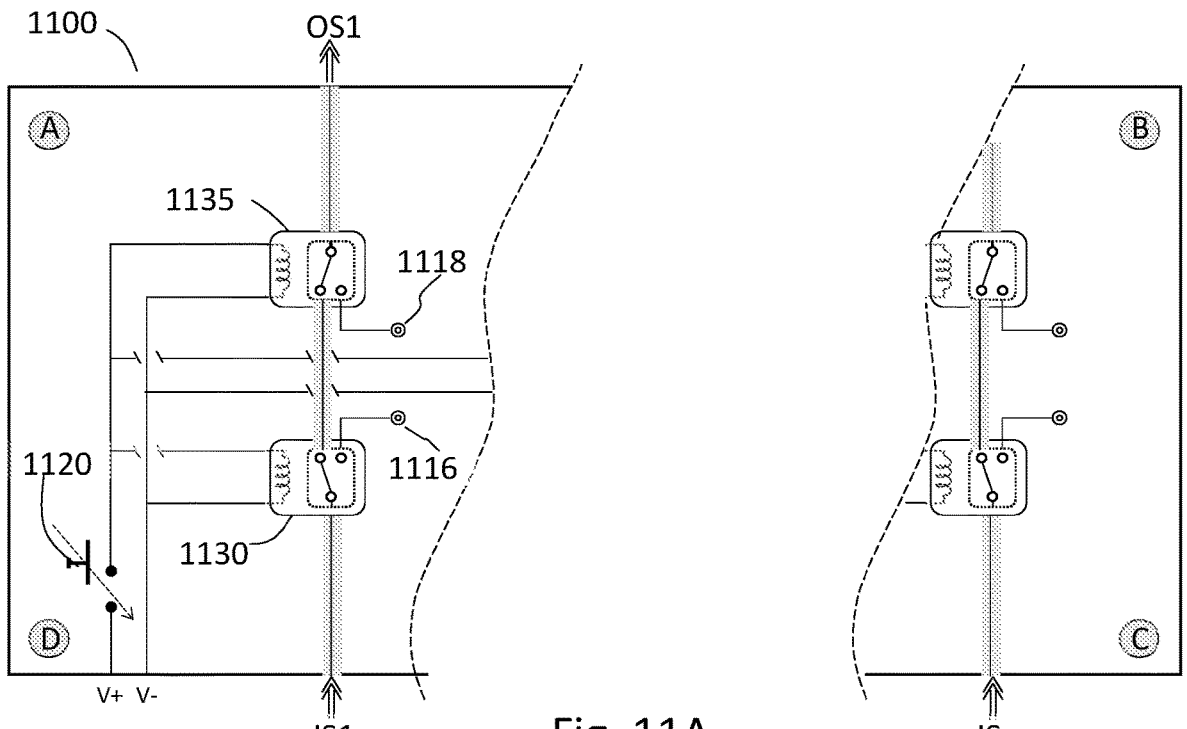
FIG. 11A is a block diagram illustrating a motherboard, according to example embodiments.

FIG. 11A is a block diagram illustrating a motherboard 1100, according to example embodiments. Motherboard 1100 may be representative of a circuit board that enables other circuit boards and components to be connected thereto. Motherboard 1100 may be configured to input and output signals obtained from processor boards. A processor board may refer to a circuit board or component that processes signals and outputs the processed signal to motherboard 1100.

As shown, motherboard 1100 may include multiple sets of components. For example, motherboard 1100 may include as few as one set of components or up to n-sets of components. For example, motherboard 1100 may be configured to receive multiple input signals, $IS_1 \ldots$ and may output multiple output signals, $OS_1 \ldots OS_n$.

Motherboard 1100 may be configured to receive a power input at V+ and V−. Motherboard 1100 may be configured to provide fault protection so that, without a daughter board (e.g., shown in FIG. 12), the input signal, $IS_1$, may be passed through to the output, $OS_1$.

As shown, motherboard 1100 may include registration pins A, B, C, and D, a switch 1120, an input relay 1130, and an output relay 1135. Switch 1120 may be controlled by electronic circuitry. Switch 1120 may be in an open position when the daughter board is not in place. Switch 1120 may be in a closed position when daughter board is in place. When daughter board is not in place, such as those shown in FIG. 11A, motherboard 1100 may be in a fault state. As such, switch 1120 is shown in FIG. 11A in the open position. In the fault position, input relay 1130 and output relay 1135 may be de-energized. In this manner, the input signal, $IS_1$, will pass directly to the output signal, $OS_1$.

Figure 11B:
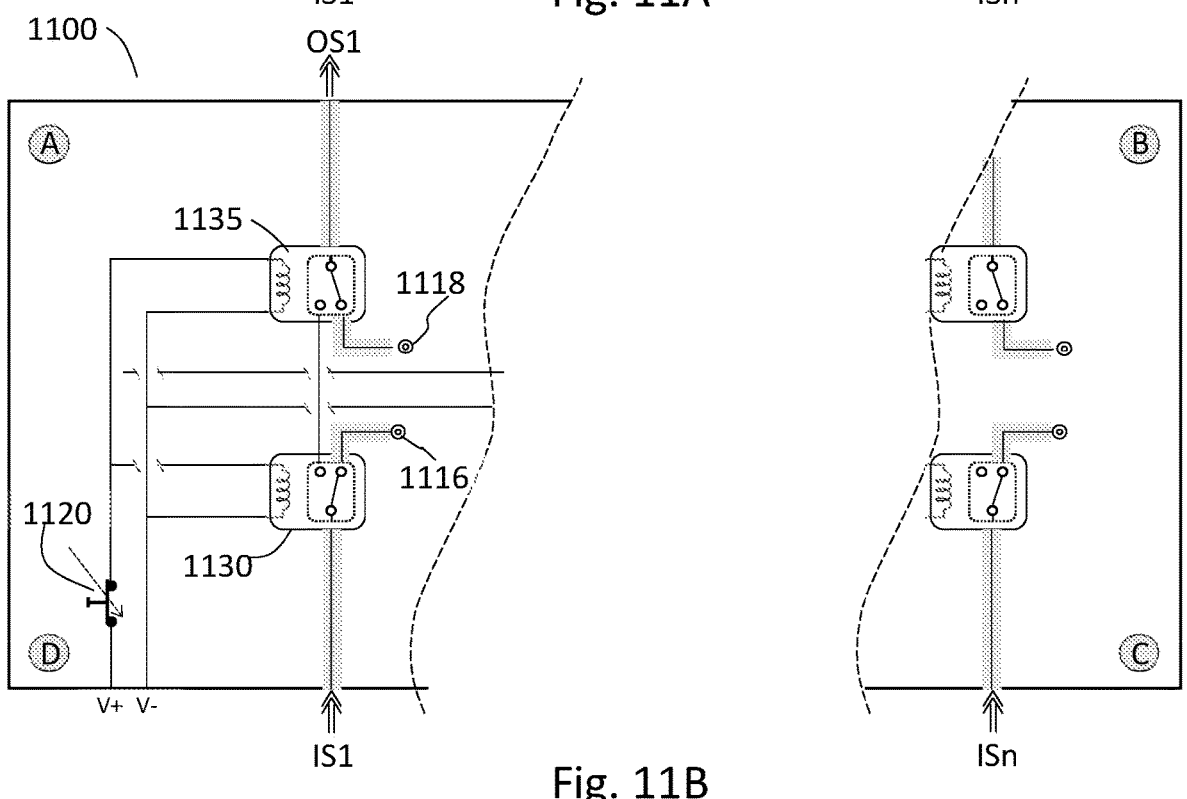
FIG. 11B is a block diagram illustrating a motherboard, according to example embodiments.

FIG. 11B is a block diagram illustrating a motherboard 1100, according to example embodiments. As shown, motherboard 1100 is in the active state. Motherboard 1100 may be in the active state when a daughter board is connected to motherboard 1100. When a daughter board is detected, switch 1120 may be moved to a closed position. When switch 1120 is closed, power may be applied to energize relay 1130. When energized, input relay 1130 may pass the input signal, $IS_1$, to transfer pad 1116. Transfer pad 1116 is configured to transfer or pass the input signal, $IS_1$, from motherboard 1100 to daughter board. Additionally, in the active state, power may be applied to energize output relay 1135. Output relay 1135 may be in communication with output pad 1118. Output pad 1118 may be configured to receive an output signal from a daughter board. The output signal received at output pad 1118 may be passed through output relay 1135 and output as output signal, $OS_1$.

Accordingly, as illustrated across FIGS. 11A and 11B, when the daughter board is in place, motherboard 1100 is in an active state, and the input signal may be sent through to the daughter board. When the daughter board is not in place, motherboard 1100 is in the fault state, and the original input signal is sent to the output.

Figure 12:
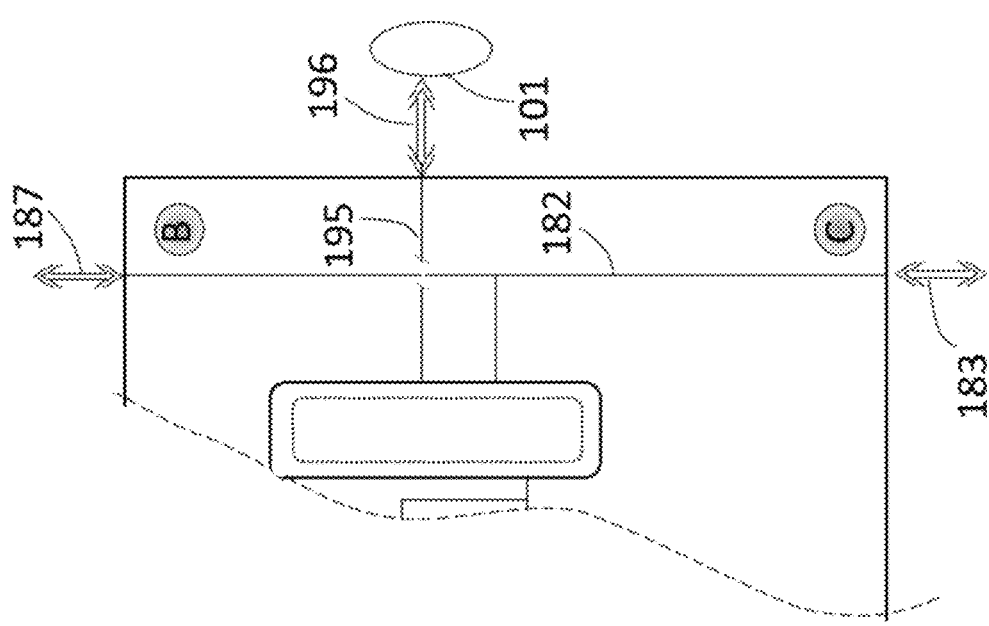
FIG. 12 is a block diagram illustrating a daughter board, according to example embodiments.
Figure 12:
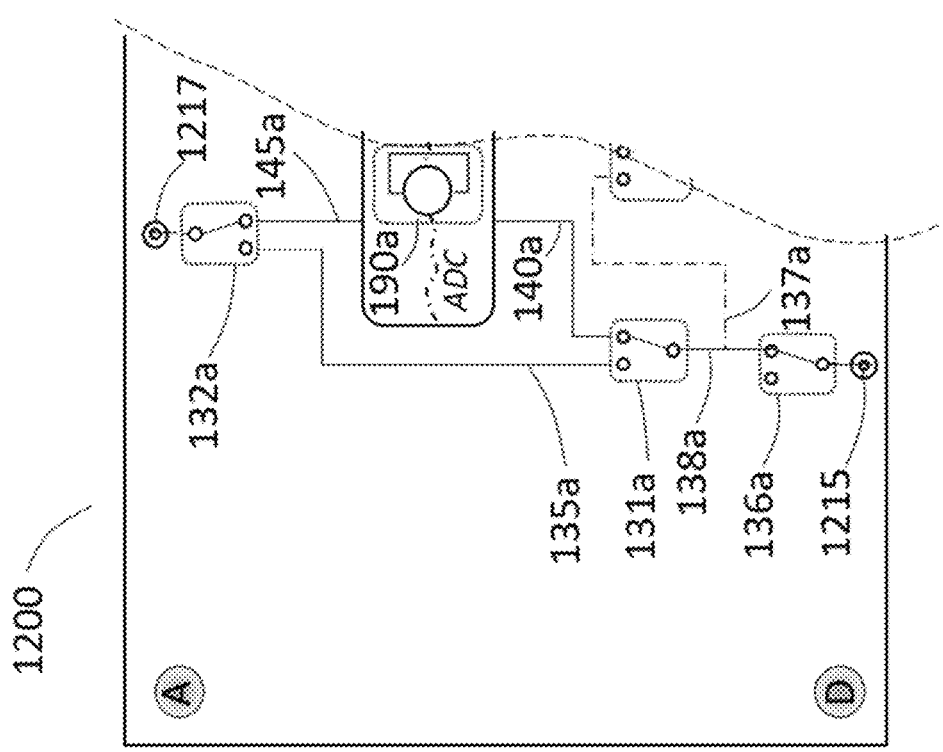

FIG. 12 is a block diagram illustrating a daughter board 1200, according to example embodiments. As shown, daughter board 1200 may include registration pins A, B, C, and D configured to interface with registration pins A, B, C, and D of motherboard 1100, respectively. Daughter board 1200 may be configured similarly to splitter board 120 and may represent a specific use-case of splitter board 120. Daughter board 1200 includes an input pad 1215 and an output pad 1217. For example, when daughter board 1200 is in place, input signal, $IS_1$ may be passed from motherboard 1100 at transfer pad 1116 to input pad 1215. Similarly, the output signal, may be passed from daughter board 1200 at output pad 1217 to motherboard 1100 at output pad 1118.

Figure 13:
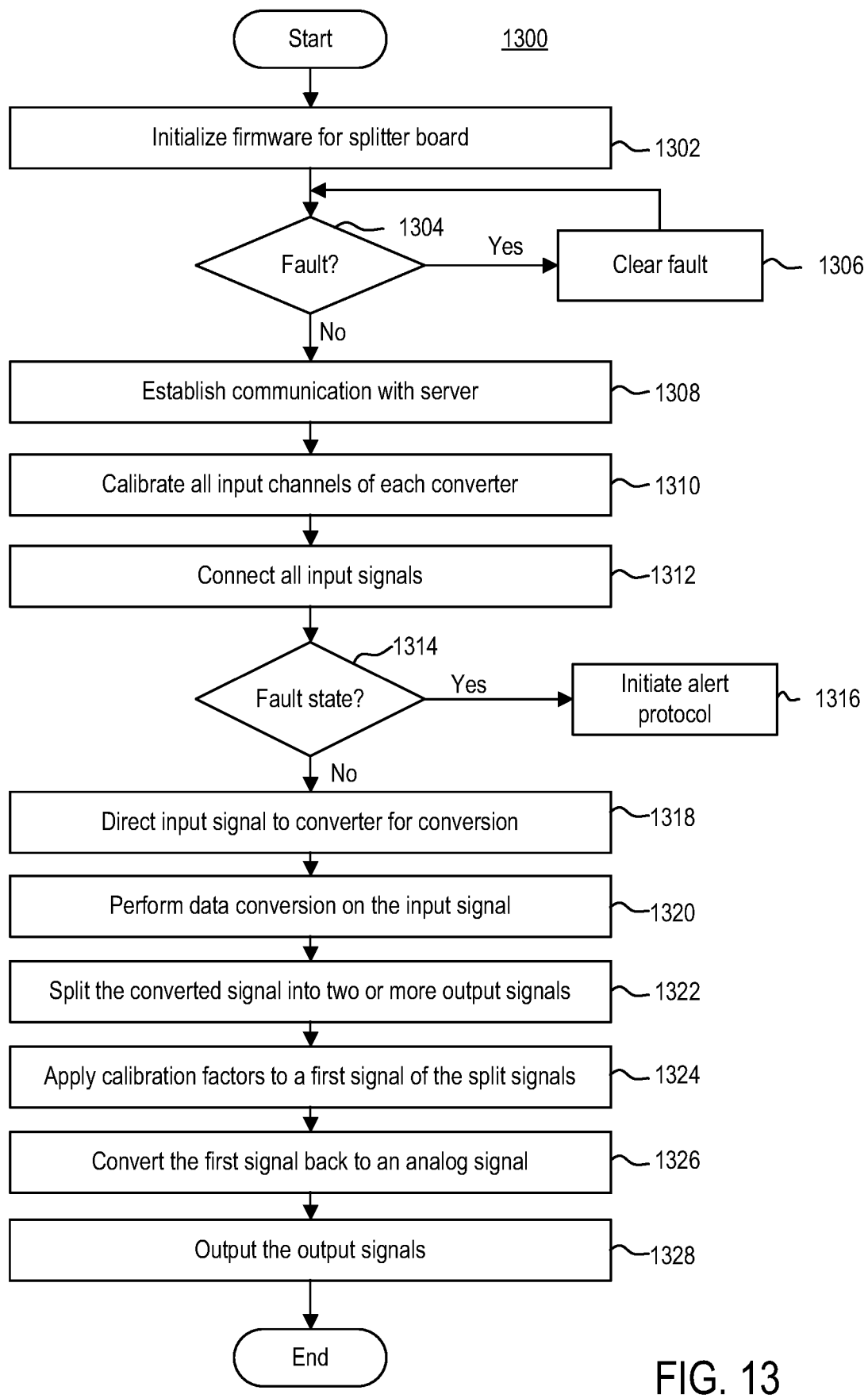
FIG. 13 is a flow diagram illustrating a method of operating a splitter board, according to example embodiments.

FIG. 13 is a flow diagram illustrating a method 1300 of operating a splitter board, according to example embodiments. Method 1300 may begin at step 1302. For ease of discussion, the below operations are discussed in conjunction with a single set of components. Those skilled in the art understand that the process may be repeated for each set of components and each input signal provided to that respective set of components.

At step 1302, microprocessor 180 may initialize firmware for the splitter board. For example, microprocessor 180 may execute a boot process, during which microprocessor 180 may check the states of each component to determine whether a fault is present.

At step 1304, microprocessor 180 determines whether there is a fault condition. In some embodiments, microprocessor 180 may determine if there is a complete board failure or a component failure.

If at step 1304, microprocessor 180 determines that there is a fault condition, then method 1300 proceeds to step 1306. At step 1306, microprocessor 180 clears the fault. If, however, at step 1304, microprocessor 180 determines that there is not a fault condition, then method 1300 proceeds to step 1308.

At step 1308, microprocessor 180 establishes a communication with the server 199. For example, splitter board may be connected to server 199 through port 185. In some embodiments, port 185 may be connected to server 199 through any means, such as, but not limited to, USB, serial, Modbus, Ethernet, or other well-known communication means.

At step 1310, microprocessor 180 may calibrate all input channels of each converter 160a-160n. The calibration process is discussed in more details below in conjunction with FIGS. 14A and 14B.

At step 1312, microprocessor 180 may connect all input signals. In some embodiments, each set of components may each a separate set of input signals associated therewith. For example, a-components may include a first set of input signals, $IS_1$. Microprocessor 180 may connect all input signals to a respective input relay. For example, input signal, $IS_1$, may be connected to bypass relay 131a. Similarly, input relay, $IS_2$, may be connected to bypass relay 131b. Input signal may be representative of one or more analog signals.

At step 1314, microprocessor 180 may determine whether the splitter board is in a fault state. A fault state may refer to a situation where a failure occurs. In some embodiments, a failure may be a general board failure. A general board failure may be when power to splitter board fails and all outputs fail. In some embodiments, a failure may be a single component failure. A single component failure may be when component of splitter board fails. For example, converter 160a or converter 160b fails.

Microprocessor 180 may determine whether the splitter board is in a fault state by reading the fault detection module of the converter. For example, microprocessor 180 may read fault detection module 190a of converter 160a and fault detection module 190b of converter 160b. Fault detection module 190a may detect faults in a variety of ways. In some embodiments, fault detection module 190a may detect faults using a general relay logic. For example, bypass relay 131a may be in an energized switched position (e.g., first state) when there is power going to splitter board 120. If the power fails, bypass relay 131a may be deenergized (e.g., a second state) and the output from bypass relay 131a may switch to fault signal 135a. In some embodiments, during the power failure, all converters (e.g., converter 160a, converter 160b, converter 160n, etc.) on splitter board 120 may be switched to a fault state. In some embodiments, embedded code logic of microprocessor 180 may be used to detect individual converter circuit failures. For example, some converters (e.g., converter 160a) may include registers, which can change during active conversion. Microprocessor 180 may check the registers to assure that they are progressively changing.

If, at step 1314, microprocessor 180 determines that the splitter board is in the fault state, then method 1300 proceeds to step 1316. At step 1316, microprocessor 180 may initiate an alert protocol. During the alert protocol, microprocessor 180 may cause the input signal to bypass the active signal circuitry and pass directly to that signal's output relay. For example, input signal, $IS_1$, may proceed directly to output signal, $OS_1$, such as that shown and described above in conjunction with FIGS. 6A and 6B.

If, however, at step 1316, microprocessor 180 determines that the splitter board is in the active state, then method 1300 proceeds to step 1318. At step 1318, microprocessor 180 may direct the input signal towards a converter for conversion. For example, microprocessor 180 may direct the input signal, $IS_1$, towards to active circuitry, such that input signal, $IS_1$, reaches the ADC/DAC of converter 160a.

At step 1320, converter may perform a data conversion on the input signal. For example, the ADC of converter 160a may convert the input signal, $IS_1$, from an analog to a digital signal. Although not shown, microprocessor 180 may continuously check for faults in the splitter board. The fault checking performed at steps 1304 and 1314 are examples of when microprocessor 180 may check for the fault state.

At step 1322, converter split the converted signal into two or more output signals. For example, converter 160a may split the converted input signal into a first signal and a second signal to be sent to microprocessor 180.

At step 1324, microprocessor 180 may apply calibration factors to the first signal. The calibration factors may be determined based on, for example, the operations discussed below in conjunction with FIGS. 14A and 14B. Microprocessor 180 may transmit the first signal, with the calibration factors applied, back to converter 160a.

At step 1326, converter 160a may convert the first signal back to an analog signal. The analog signal is based on the digital signal and the calibration factors that were applied to the digital signal by microprocessor 180.

At step 1328, splitter board may output the data signals. For example, an analog signal may be output from splitter board as output signal, $OS_1$, via output relay 132a, for downstream processes. Similarly, microprocessor 180 may output the digital signal to server 199 for analysis.

Figure 14A:
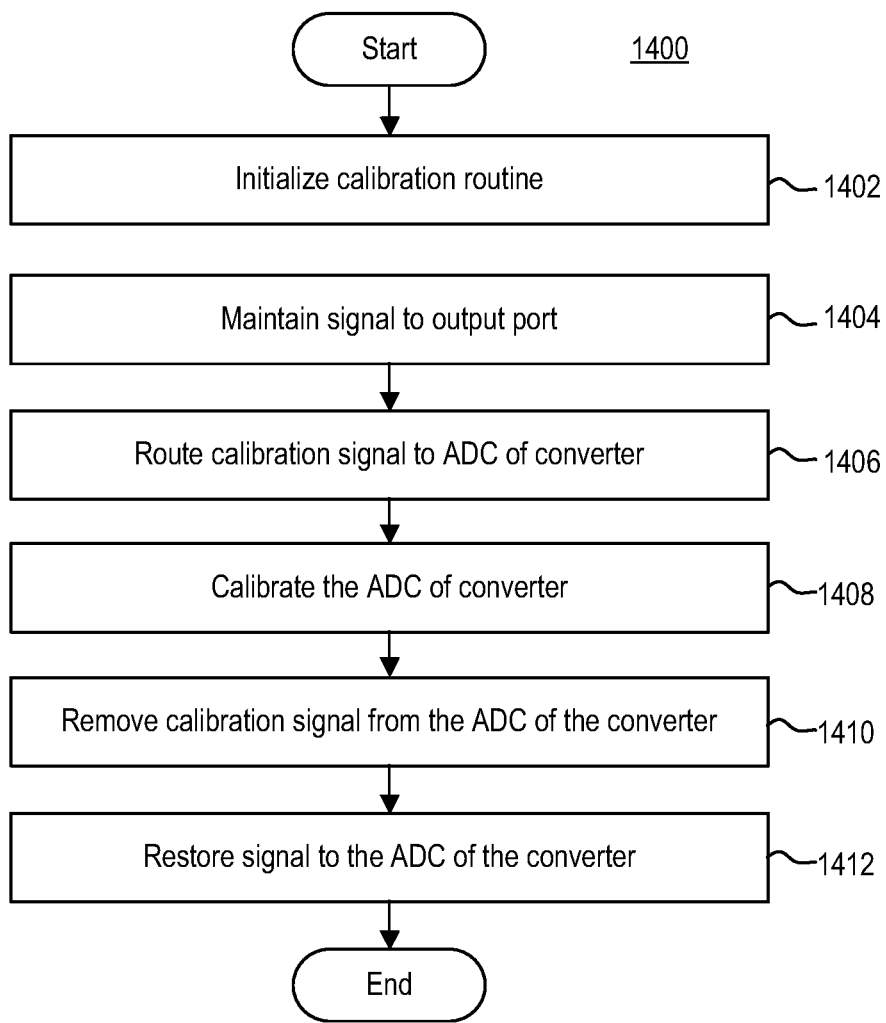
FIG. 14A is a flow diagram illustrating a method of calibrating a splitter board, according to example embodiments.

FIG. 14A is a flow diagram illustrating a method 1400 of calibrating a splitter board, according to example embodiments. Method 1400 may be particularly applicable to calibrating splitter boards discussed above in conjunction with FIGS. 1-3 and 9. For ease of discussion, the below operations are discussed in conjunction with a single set of components. Those skilled in the art understand that the process may be repeated for each set of components and each input signal provided to that respective set of components. Method 1400 may begin at step 1402.

At step 1402, microprocessor 180 may initialize the calibration routine. In some embodiments the calibration routine may be initialized through server 199. In some embodiments, the calibration routine may reside in firmware or on microprocessor 180.

At step 1404, splitter board may maintain signal to the output port, e.g., $OS_1$, and may remove the signal from the ADC of converter 160a. For example, microprocessor 180 may cause bypass relay 131a to switch states, such that input signal $IS_1$ is not sent to converter 160a. Instead, signals for calibration device 142 may be used to calibrate the ADC of converter 160a. Further, the DAC of converter 160a may output a buffered analog output signal.

At step 1406, splitter board may route a calibration signal to the ADC of converter 160a. For example, microprocessor 180 may activate calibration relay 141 causing the signal from calibration device 142 to be sent to the ADC of converter 160a through bypass relay 131a.

At step 1408, splitter board may calibrate the ADC of converter 160*a*. In some embodiments, appropriate signals may be directed to the ADC of converter 160*a*, sequentially in order. For example, zero and span signals (LRS and HRS). Calibration constants may be calculated and stored by microprocessor 180.

At step 1410, splitter board may remove the calibration signal from the ADC of converter 160*a*. For example, microprocessor 180 may deactivate calibration relay 141 causing the signal from calibration device 142 to no longer pass to ADC of converter 160*a*.

At step 1412, splitter board may restore signal to the ADC of converter 160*a*. For example, microprocessor 180 may cause bypass relay 131*a* to switch states, such that input signal $IS_1$ is sent to converter 160*a*.

Figure 14B:
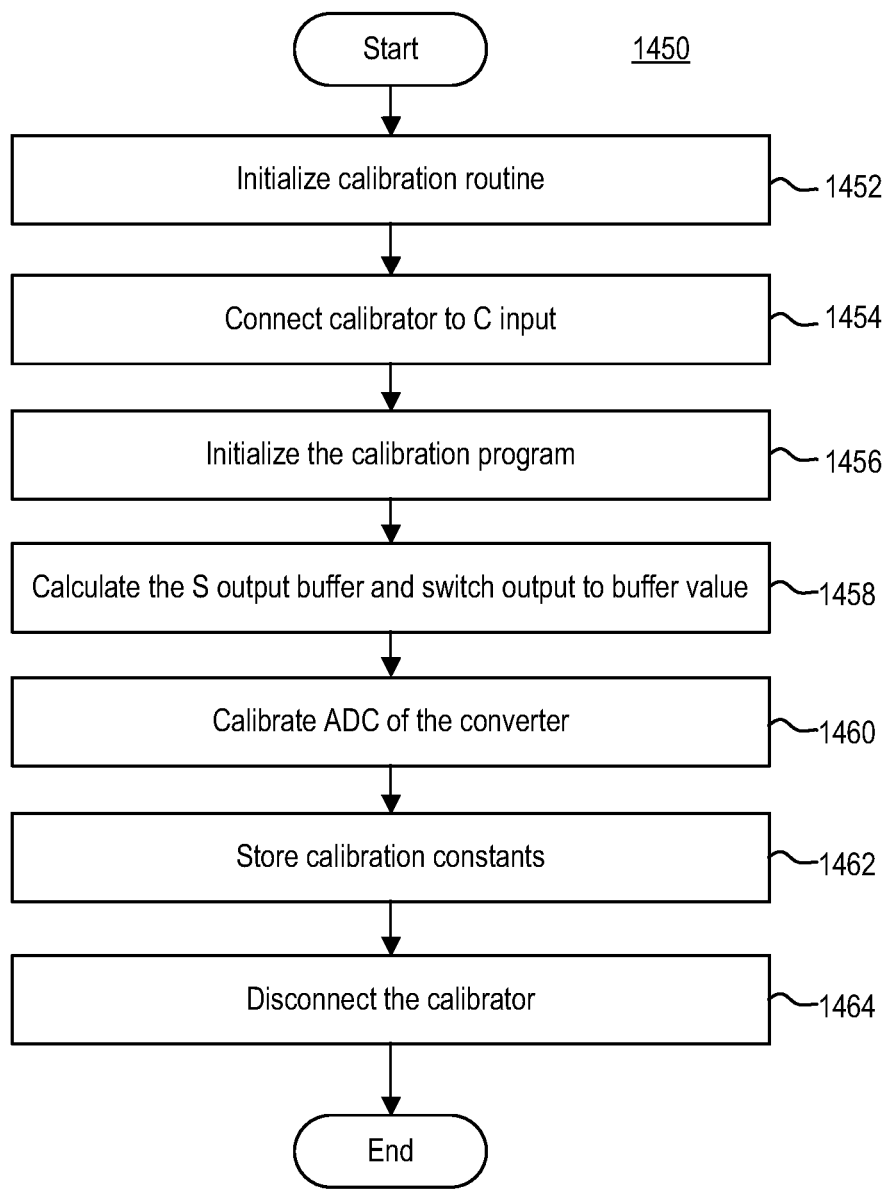
FIG. 14B is a flow diagram illustrating a method of calibrating a splitter board, according to example embodiments.

FIG. 14B is a flow diagram illustrating a method 1450 of calibrating a splitter board, according to example embodiments. Method 1450 may be particularly applicable to calibrating splitter boards discussed above in conjunction with FIG. 10. For ease of discussion, the below operations are discussed in conjunction with a single set of components. Those skilled in the art understand that the process may be repeated for each set of components and each input signal provided to that respective set of components. Method 1450 may begin at step 1452.

At step 1452, splitter board may initialize a calibration routine. For example, microprocessor 180 may communicate with server 199 to initiate the calibration routine.

At step 1454, splitter board may connect calibrator to the C input.

At step 1456, splitter board may initialize the calibration program.

At step 1458, splitter board may calculate the S output buffer and may switch output to buffer value. In some embodiments, the calibration of the ADC of converter 160*a* may take between 10 microseconds and several seconds, depending on the system. The time required for calibration may be estimated, and an equivalent time should bn be used to collect and buffer the input signals.

At step 1460, splitter board may calibrate the ADC of converter 160*a*. In some embodiments, when calibration begins, the buffered signal may be sent to the output. When calibration is complete, the live signal may again be processed.

At step 1462, splitter board may store the calibration constants. Microprocessor 180 may later apply the calibration inputs to the input signal, such as that described in FIG. 13 above.

At step 1464, splitter board may disconnect the calibrator. Splitter board may reconnect to the input signal, $IS_1$.

Following completion of calibration, microprocessor 180 may return the DAC of converter 160*a* to real-time output. Microprocessor 180 may further return calibration relay 141 to its original state. Microprocessor 180 may further return input relay 136*a* to its previous state, returning the input signal to the ADC of converter 160*a*.

In some embodiments, the calibration signal may be directed through bypass relay 131*a* so that the calibration signal may be subject to the same circuitry as the original input signal, $IS_1$. For example, if there is amplification of the input signal between input relay 136*a* and bypass relay 131*a* or between bypass relay 131*a* and converter 160*a*, the calibration signal may be passed through the same circuitry. Generally, calibration device 142 may be configured to calibrate any converter of splitter board via calibration relay 141, which may direct the calibration signal to other ADCs of other converters.

Figure 15A:
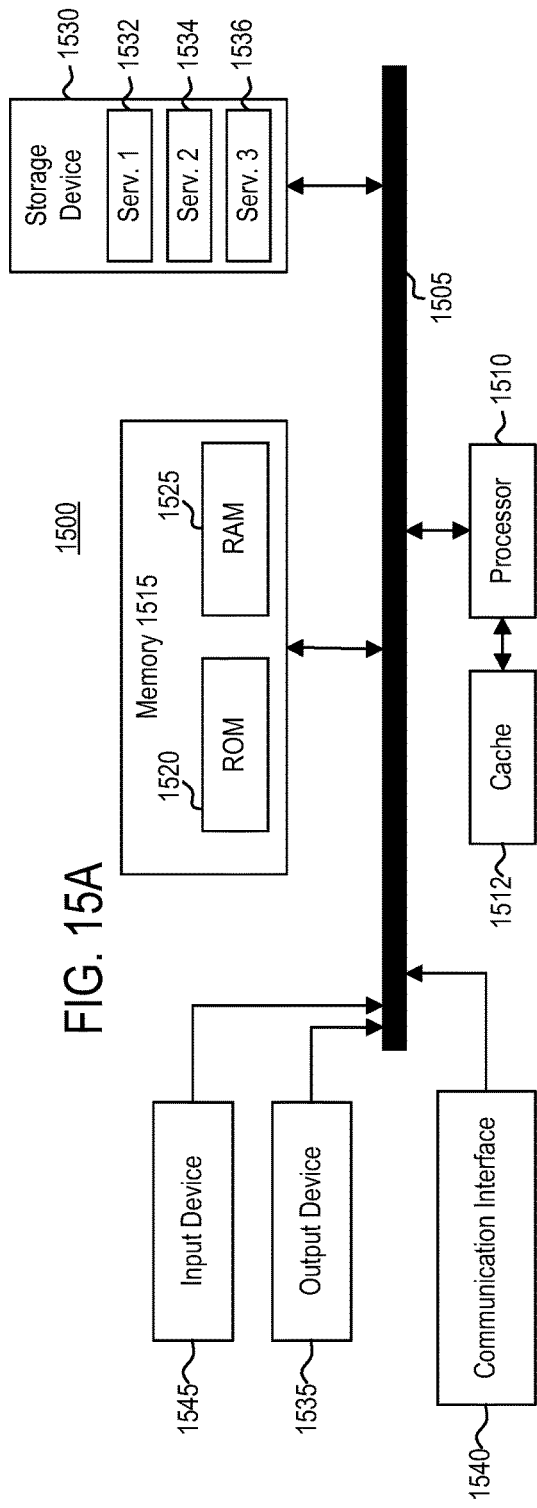
FIG. 15A is a block diagram illustrating a computing device, according to example embodiments.

FIG. 15A illustrates a system bus architecture of computing system 1500, according to example embodiments. System 1500 may be representative of at least a portion of microprocessor 180. One or more components of system 1500 may be in electrical communication with each other using a bus 1505. System 1500 may include a processing unit (CPU or processor) 1510 and a system bus 1505 that couples various system components including the system memory 1515, such as read only memory (ROM) 1520 and random access memory (RAM) 1525, to processor 1510. System 1500 may include a cache of high-speed memory connected directly with, in close proximity to, or integrated as part of processor 1510. System 1500 may copy data from memory 1515 and/or storage device 1530 to cache 1512 for quick access by processor 1510. In this way, cache 1512 may provide a performance boost that avoids processor 1510 delays while waiting for data. These and other modules may control or be configured to control processor 1510 to perform various actions. Other system memory 1515 may be available for use as well. Memory 1515 may include multiple different types of memory with different performance characteristics. Processor 1510 may include any general purpose processor and a hardware module or software module, such as service 1 1532, service 2 1534, and service 3 1536 stored in storage device 1530, configured to control processor 1510 as well as a special-purpose processor where software instructions are incorporated into the actual processor design. Processor 1510 may essentially be a completely self-contained computing system, containing multiple cores or processors, a bus, memory controller, cache, etc. A multi-core processor may be symmetric or asymmetric.

To enable user interaction with the computing system 1500, an input device 1545 may represent any number of input mechanisms, such as a microphone for speech, a touch-sensitive screen for gesture or graphical input, keyboard, mouse, motion input, speech and so forth. An output device 1535 may also be one or more of a number of output mechanisms known to those of skill in the art. In some instances, multimodal systems may enable a user to provide multiple types of input to communicate with computing system 1500. Communications interface 1540 may generally govern and manage the user input and system output. There is no restriction on operating on any particular hardware arrangement and therefore the basic features here may easily be substituted for improved hardware or firmware arrangements as they are developed.

Storage device 1530 may be a non-volatile memory and may be a hard disk or other types of computer readable media which may store data that are accessible by a computer, such as magnetic cassettes, flash memory cards, solid state memory devices, digital versatile disks, cartridges, random access memories (RAMs) 1525, read only memory (ROM) 1520, and hybrids thereof.

Storage device 1530 may include services 1532, 1534, and 1536 for controlling the processor 1510. Other hardware or software modules are contemplated. Storage device 1530 may be connected to system bus 1505. In one aspect, a hardware module that performs a particular function may include the software component stored in a computer-readable medium in connection with the necessary hardware components, such as processor 1510, bus 1505, output device 1535 (e.g., display), and so forth, to carry out the function.

Figure 15B:
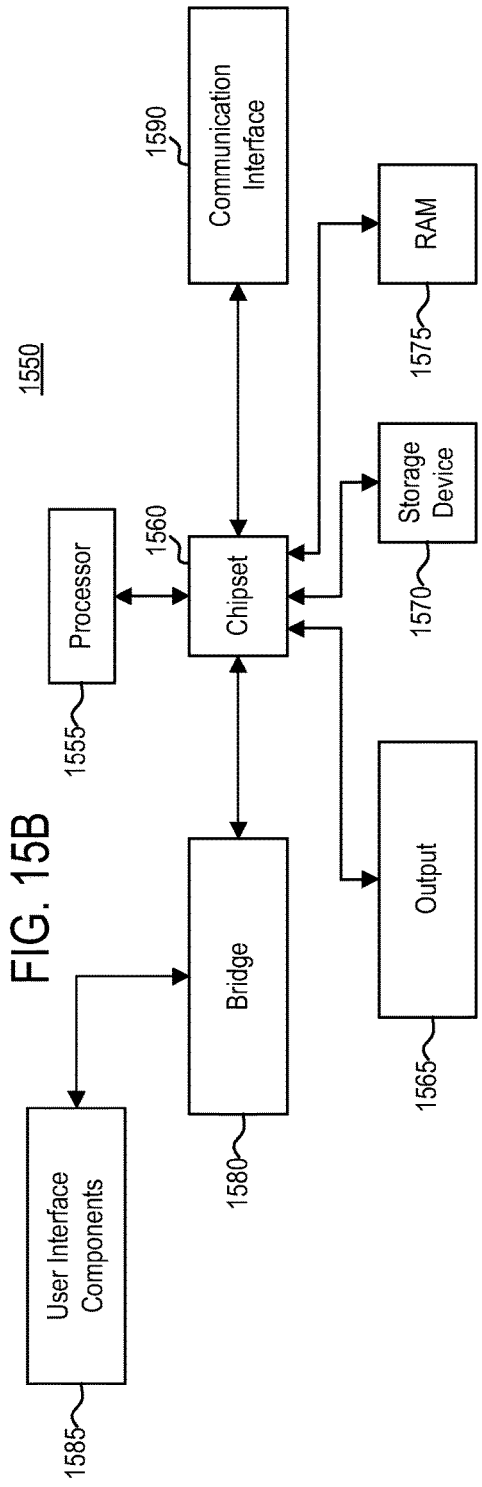
FIG. 15B is a block diagram illustrating a computing device, according to example embodiments.

FIG. 15B illustrates a computer system 1550 having a chipset architecture that may represent at least a portion of microprocessor 180. Computer system 1550 may be an example of computer hardware, software, and firmware that may be used to implement the disclosed technology. System 1550 may include a processor 1555, representative of any number of physically and/or logically distinct resources capable of executing software, firmware, and hardware configured to perform identified computations. Processor 1555 may communicate with a chipset 1560 that may control input to and output from processor 1555. In this example, chipset 1560 outputs information to output 1565, such as a display, and may read and write information to storage device 1570, which may include magnetic media, and solid state media, for example. Chipset 1560 may also read data from and write data to storage device 1575 (e.g., RAM). A bridge 1580 for interfacing with a variety of user interface components 1585 may be provided for interfacing with chipset 1560. Such user interface components 1585 may include a keyboard, a microphone, touch detection and processing circuitry, a pointing device, such as a mouse, and so on. In general, inputs to system 1550 may come from any of a variety of sources, machine generated and/or human generated.

Chipset 1560 may also interface with one or more communication interfaces 1590 that may have different physical interfaces. Such communication interfaces may include interfaces for wired and wireless local area networks, for broadband wireless networks, as well as personal area networks. Some applications of the methods for generating, displaying, and using the GUI disclosed herein may include receiving ordered datasets over the physical interface or be generated by the machine itself by processor 1555 analyzing data stored in storage device 1570 or storage device 1575. Further, the machine may receive inputs from a user through user interface components 1585 and execute appropriate functions, such as browsing functions by interpreting these inputs using processor 1555.

It may be appreciated that example systems 1500 and 1550 may have more than one processor 1510 or be part of a group or cluster of computing devices networked together to provide greater processing capability.

While the foregoing is directed to embodiments described herein, other and further embodiments may be devised without departing from the basic scope thereof. For example, aspects of the present disclosure may be implemented in hardware or software or a combination of hardware and software. One embodiment described herein may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory (ROM) devices within a computer, such as CD-ROM disks readably by a CD-ROM drive, flash memory, ROM chips, or any type of solid-state non-volatile memory) on which information is permanently stored; and (ii) writable storage media (e.g., floppy disks within a diskette drive or hard-disk drive or any type of solid state random-access memory) on which alterable information is stored. Such computer-readable storage media, when carrying computer-readable instructions that direct the functions of the disclosed embodiments, are embodiments of the present disclosure.

It will be appreciated to those skilled in the art that the preceding examples are exemplary and not limiting. It is intended that all permutations, enhancements, equivalents, and improvements thereto are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

The invention claimed is:

1. A system comprising:
a splitter board comprising:
a converter comprising analog-to-digital circuitry and digital-to-analog circuitry;
a bypass coupled with the converter, the bypass configurable between a first state and a second state; and
a microprocessor coupled with the converter and the bypass, the microprocessor configured to switch the bypass between the first state and the second state,
wherein, in the first state, the bypass directs an input signal to the converter, wherein the converter converts the input signal to a converted input signal and splits the converted input signal into a first portion and a second portion, wherein the microprocessor directs the first portion to an output port of the splitter board for downstream processes and outputs the second portion to an external server device, and
wherein, in the second state, the bypass causes the input signal to bypass the converter and directs the input signal to the output port of the splitter board for the downstream processes.

2. The system of claim 1, further comprising:
a second converter coupled with the microprocessor, the second converter comprising second analog-to-digital circuitry and second digital-to-analog circuitry;
a second bypass coupled with the microprocessor and the second converter, the second bypass configurable between the first state and the second state; and
the microprocessor further configured to switch the second bypass between the first state and the second state,
wherein, in the first state, the second bypass directs a second input signal to the second converter, wherein the second converter converts the second input signal to a second converted input signal and splits the second converted input signal into a third portion and a fourth portion, the third portion directed to the microprocessor, the fourth portion directed to a second output port of the splitter board for the downstream processes and wherein, in the second state, the second bypass causes the second input signal to bypass the second converter and direct the second input signal to the second output port of the splitter board for the downstream processes.

3. The system of claim 2, wherein the bypass is in the first state and the second bypass is in the second state.

4. The system of claim 1, further comprising:
calibration circuitry coupled with the converter and the microprocessor, the calibration circuitry configured to calibrate the analog-to-digital circuitry of the converter.

5. The system of claim 4, wherein the converter is configured to buffer the input signal.

6. The system of claim 5, wherein the converter outputs the buffered input signal while the calibration circuitry calibrates the analog-to-digital circuitry of the converter.

7. The system of claim 1, wherein the converter further comprises a fault detection module, the fault detection module configured to detect when at least one component of the splitter board fails.

8. The system of claim 7, wherein the microprocessor is configured to read the fault detection module to determine when the at least one component of the splitter board fails.

9. The system of claim 8, wherein, upon determining that the converter has failed, the microprocessor is configured to cause the bypass to switch from the first state to the second state.

10. The system of claim 1, wherein the microprocessor is configured to apply calibration factors to the first portion and direct the first portion back to the converter for output at the output port.

11. The system of claim 1, further comprising:
a second splitter board in communication with the splitter board, the second splitter board comprising:
   a second converter comprising second analog-to-digital circuitry and second digital-to-analog circuitry;
   a second bypass coupled with the second converter, the second bypass configurable between a third state and a fourth state; and
   a second microprocessor coupled with the second converter and the second bypass, the second microprocessor configured to switch the second bypass between the third state and the fourth state,
   wherein, in the third state, the second bypass directs a second input signal to the second converter, wherein the second converter converts the second input signal to a second converted input signal and splits the second converted input signal into a third portion and a fourth portion, wherein the second microprocessor directs the third portion to a second output port of the splitter board for downstream processes, and outputs the fourth portion to the external server device, and
   wherein, in the fourth state, the second bypass causes the second input signal to bypass the second converter and directs the second input signal to the second output port of the splitter board for output to the second microprocessor of the splitter board.

12. The system of claim 11, wherein the splitter board is a host splitter board and the second splitter board is an auxiliary splitter board, the splitter board and the second splitter board arranged in a daisy chain.

13. The system of claim 11, wherein the second microprocessor is configured to apply calibration factors to the third portion and direct the third portion back to the second converter for output at the second output port.

14. A splitter board comprising:
a converter comprising analog-to-digital circuitry and digital-to-analog circuitry;
a bypass coupled with the converter, the bypass configurable between a first state and a second state, wherein, in the first state, the bypass directs an input signal to the converter wherein the converter splits the input signal into a first portion and a second portion, the first portion directed to an output port for downstream processes and wherein, in the second state, the bypass causes the input signal to bypass the converter and directs the input signal to the output port for the downstream processes; and
calibration circuitry configured to calibrate the converter, wherein the converter is configured to apply calibration factors to the first portion prior to output.

15. The splitter board of claim 14, wherein the calibration circuitry comprises:
a calibration device configured to calibrate the converter; and
a calibration relay configured to redirect the input signal from the converter to the converter.

16. The splitter board of claim 15, further comprising:
a microprocessor coupled to the converter, the bypass, and the calibration circuitry, the microprocessor configured to place the converter into a calibration state during calibration.

17. The splitter board of claim 16, wherein the calibration device is configured to utilize calibration signals to calibrate the converter, the calibration signals comprising a low reference signal and a high reference signal.

18. The splitter board of claim 17, wherein the microprocessor is configured to change the calibration signals from the low reference signal to the high reference signal.

19. The splitter board of claim 14, further comprising:
a second converter comprising second analog-to-digital circuitry and second digital-to-analog circuitry;
a second bypass coupled with the second converter, the second bypass configurable between a third state and a fourth state, wherein, in the third state, the second bypass directs a second input signal to the second converter wherein the second converter splits the second input signal into a third portion and a fourth portion, the third portion directed to a second output port for the downstream processes and wherein, in the fourth state, the second bypass causes the second input signal to bypass the second converter and directs the second input signal to the second output port for the downstream processes; and
wherein the calibration circuitry is further configured to calibrate the second converter, wherein the second converter is configured to apply second calibration factors to the third portion prior to output.

20. A method comprising:
receiving an input signal at a bypass of a splitter board;
directing, by the bypass, the input signal to a converter of the splitter board;
splitting, by the converter, the input signal into a first portion and a second portion;
applying, by a microprocessor, calibration factors to the first portion of the input signal;
directing the first portion of the input signal to an output port of the splitter board for downstream processes; and
directing the second portion of the input signal to an external server device.

* * * * *